(12) United States Patent
Huang et al.

(10) Patent No.: US 12,237,419 B2
(45) Date of Patent: Feb. 25, 2025

(54) GATE STRUCTURES IN TRANSISTOR DEVICES AND METHODS OF FORMING SAME

(71) Applicant: Taiwan Semiconductor Manufacturing Co., Ltd., Hsinchu (TW)

(72) Inventors: Yu-Lien Huang, Jhubei (TW); Tze-Liang Lee, Hsinchu (TW); Jr-Hung Li, Chupei (TW); Chi-Hao Chang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 382 days.

(21) Appl. No.: 17/668,143

(22) Filed: Feb. 9, 2022

(65) Prior Publication Data
US 2023/0033289 A1 Feb. 2, 2023

Related U.S. Application Data

(60) Provisional application No. 63/226,828, filed on Jul. 29, 2021.

(51) Int. Cl.
*H01L 29/78* (2006.01)
*H01L 29/06* (2006.01)
*H01L 29/423* (2006.01)
*H01L 29/66* (2006.01)
*H01L 29/786* (2006.01)

(52) U.S. Cl.
CPC ...... *H01L 29/7851* (2013.01); *H01L 29/0665* (2013.01); *H01L 29/42392* (2013.01); *H01L 29/6653* (2013.01); *H01L 29/66795* (2013.01); *H01L 29/78696* (2013.01)

(58) Field of Classification Search
CPC ......... H01L 21/02603; H01L 21/28141; H01L 21/823431; H01L 21/823821; H01L 21/845; H01L 27/0886; H01L 27/0924; H01L 27/1211; H01L 29/0653; H01L 29/0665; H01L 29/0669; H01L 29/0673; H01L 29/41791; H01L 29/42392; H01L 29/66439; H01L 29/6653; H01L 29/66553; H01L 29/66545; H01L 29/6656; H01L 29/66795; H01L 29/775; H01L 29/785; H01L 29/7851; H01L 29/7853;
(Continued)

(56) References Cited

U.S. PATENT DOCUMENTS 9,105,490 B2 8/2015 Wang et al.
9,236,267 B2 1/2016 De et al.
(Continued)

FOREIGN PATENT DOCUMENTS

TW 202036682 A 10/2020

*Primary Examiner* — David C Spalla
(74) *Attorney, Agent, or Firm* — Slater Matsil, LLP

(57) ABSTRACT

A method includes forming a first source/drain region and a second source/drain region in a semiconductor fin; depositing a first dielectric layer over the first source/drain region and the second source/drain region; etching an opening through the first dielectric layer, wherein etching the opening comprises etching the first dielectric layer; forming first sidewall spacers on sidewalls of the opening; and forming a gate stack in the opening, wherein the gate stack is disposed between the first sidewall spacers.

20 Claims, 28 Drawing Sheets

(58) Field of Classification Search
CPC ........... H01L 29/7855; H01L 29/78696; H01L 2029/7858
See application file for complete search history.

(56) References Cited

U.S. PATENT DOCUMENTS

| | | | |
|---|---|---|---|
| 9,236,300 | B2 | 1/2016 | Liaw |
| 9,406,804 | B2 | 8/2016 | Huang et al. |
| 9,443,769 | B2 | 9/2016 | Wang et al. |
| 9,520,482 | B1 | 12/2016 | Chang et al. |
| 9,548,366 | B1 | 1/2017 | Ho et al. |
| 9,576,814 | B2 | 2/2017 | Wu et al. |
| 9,831,183 | B2 | 11/2017 | Lin et al. |
| 9,859,386 | B2 | 1/2018 | Ho et al. |
| 11,069,531 | B2 | 7/2021 | Chen et al. |
| 2017/0162668 | A1* | 6/2017 | Kim ................... H01L 29/7851 |
| 2018/0174846 | A1* | 6/2018 | Wang ................. H01L 29/0847 |
| 2020/0395482 | A1* | 12/2020 | Song .................... B82Y 10/00 |
| 2021/0074829 | A1* | 3/2021 | Tang ................ H01L 21/31155 |
| 2021/0119021 | A1* | 4/2021 | Colombeau ....... H01L 29/66469 |

* cited by examiner

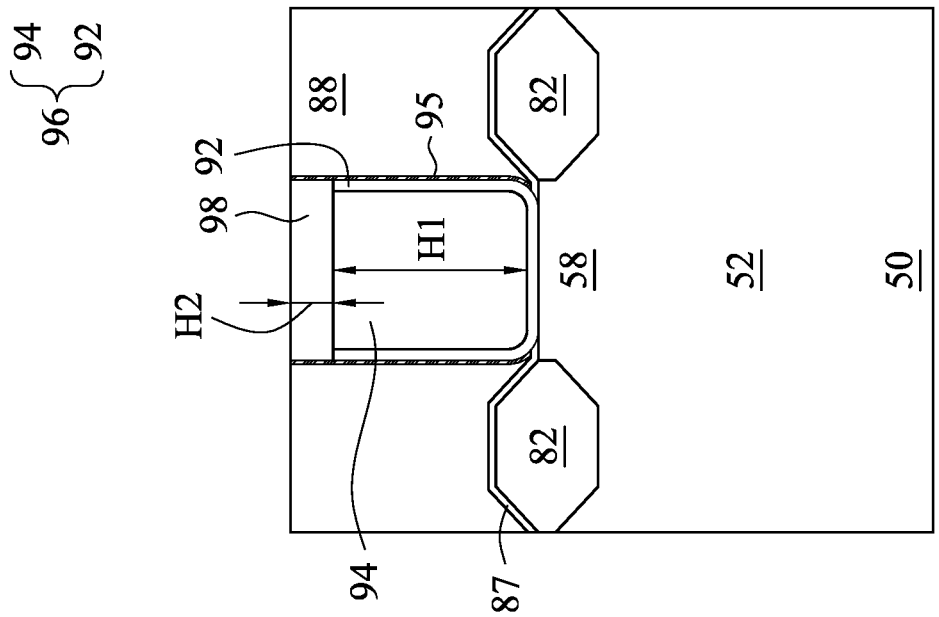
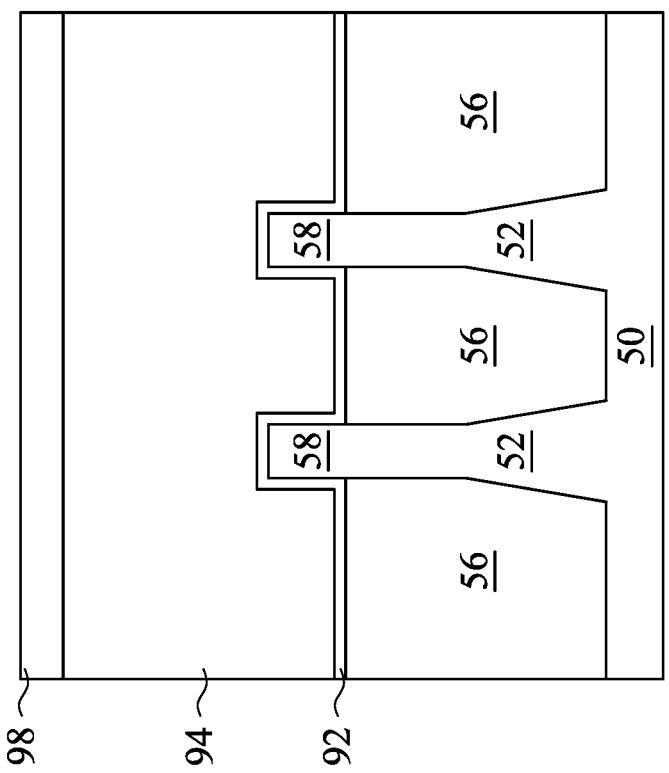
Figure 15B
Figure 15A

GATE STRUCTURES IN TRANSISTOR DEVICES AND METHODS OF FORMING SAME

PRIORITY CLAIM AND CROSS-REFERENCE

This application claims the benefit of U.S. Provisional Application No. 63/226,828, filed on Jul. 29, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7A, 7B, 7C, 8A, 8B, 8C, 8D, 8E, 9A, 9B, 9C, 10A, 10B, 11A, 11B, 12A, 12B, 13A, 13B, 14A, 14B, 15A, 15B, 16A, 16B, 16C, 17A, 17B, and 17C are cross-sectional views of intermediate stages in the manufacturing of FinFETs, in accordance with some embodiments.

DETAILED DESCRIPTION

Figure 1:
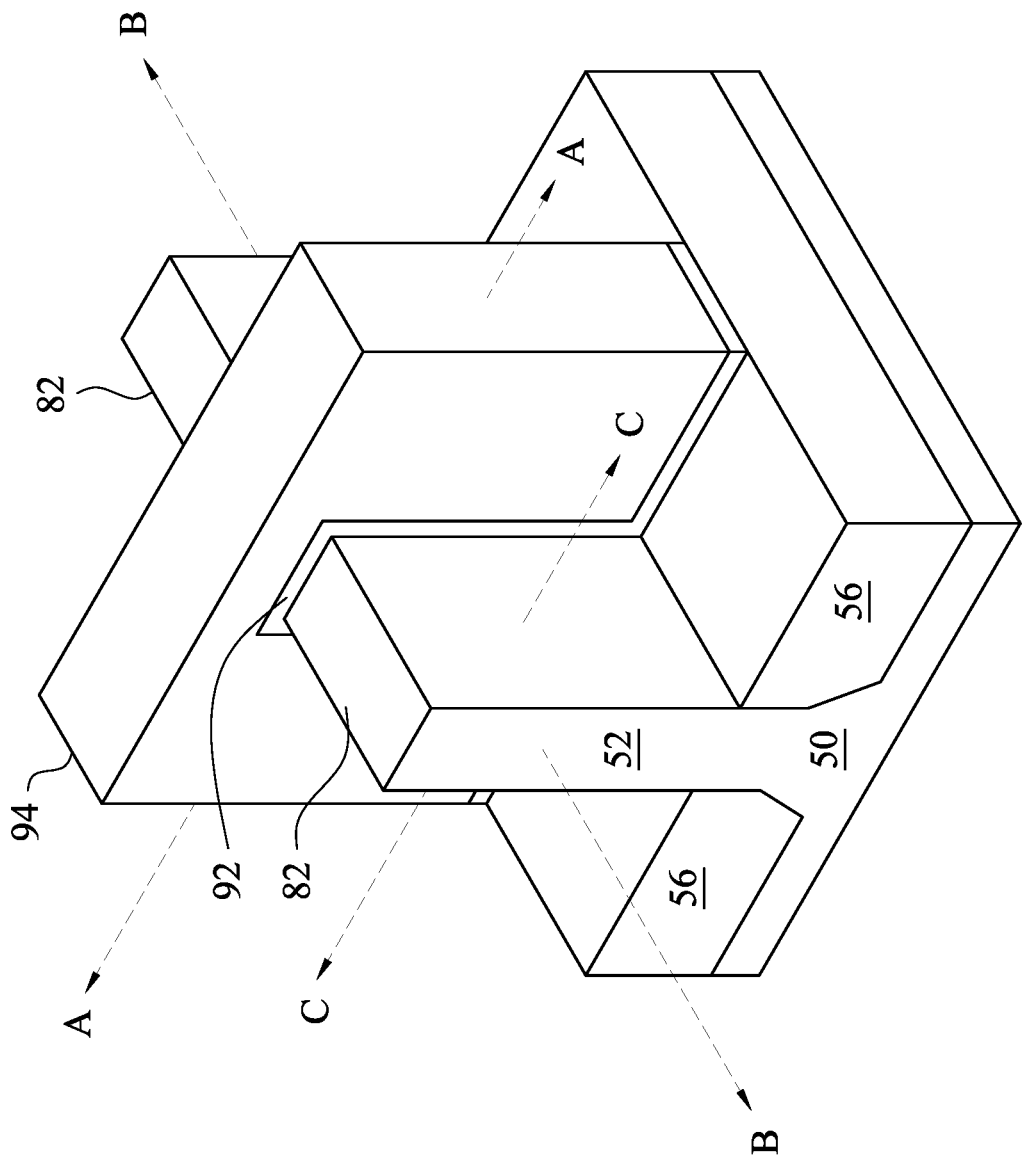
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide a gate structure in a transistor device and methods of forming same. The gate structure may be formed without first forming any dummy gate structures (e.g., a polysilicon gate structure). For example, an interlayer dielectric (ILD) may be deposited directly on channel regions and source/drain regions of a substrate. The ILD may then be etched to define openings exposing the channel regions, and various layers of gate dielectrics and gate electrode materials may be deposited in the openings, thereby forming gate stacks. Accordingly, various advantages can be achieved, such as a simplified process flow, easier processing (e.g., without having to pattern high aspect ratio, dummy gates), and reduced manufacturing cost.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NSFETs), or the like.

FIGS. 2 through 17C are cross-sectional views of intermediate stages in the manufacturing of FinFETs, in accordance with some embodiments. FIGS. 2 through 6 illustrate reference cross-section A-A illustrated in FIG. 1, except for multiple fins/FinFETs. FIGS. 7A, 8A, 9A, 10A, 11A, 12A, 13A, 14A, 15A, 16A, and 17A are illustrated along reference cross-section A-A illustrated in FIG. 1, and FIGS. 7B, 8B, 9B, 10B, 11B, 12B, 13B, 14B, 15B, 16B, and 17B are illustrated along a similar cross-section B-B illustrated in FIG. 1, except for multiple fins/FinFETs. FIGS. 7C, 8C, 8D, 8E, 9C, 16C, and 17C are illustrated along reference cross-section C-C illustrated in FIG. 1, except for multiple fins/FinFETs.

Figure 2:
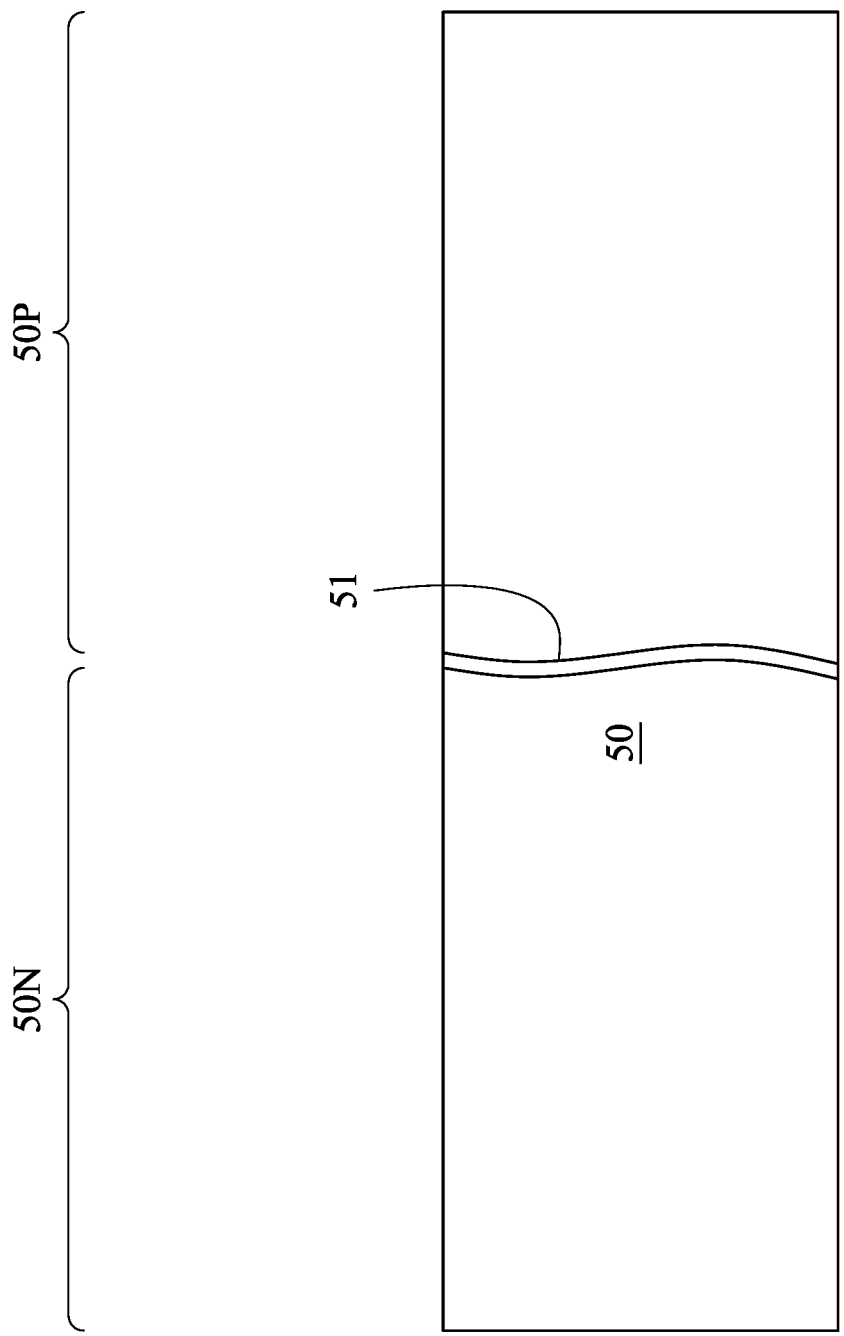

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated from the p-type region 50P (as illustrated by divider 51), and any number of device features (e.g., other active devices, doped regions, isolation structures, etc.) may be disposed between the n-type region 50N and the p-type region 50P.

Figure 3:
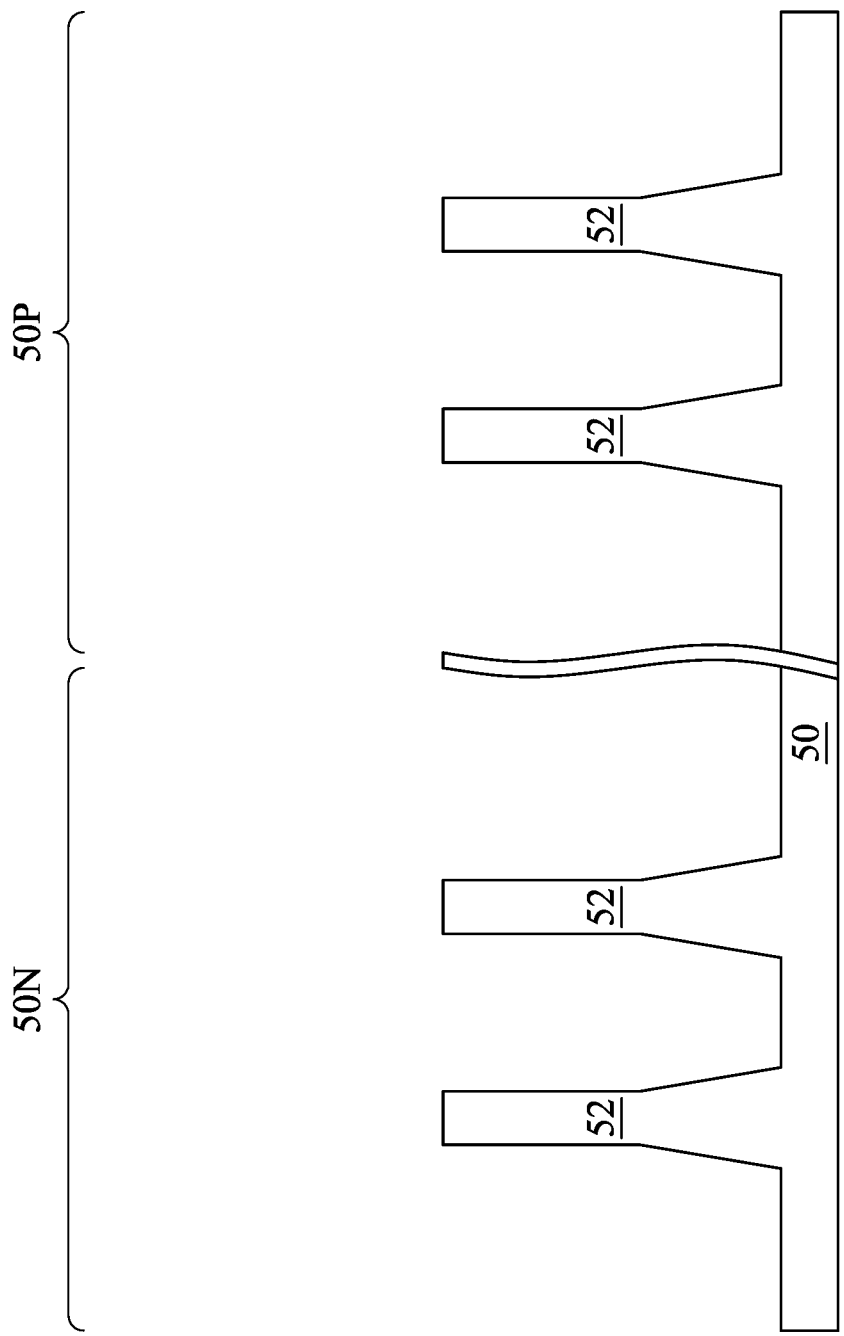

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins 52 may be patterned using one or more photolithography and etching processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

Figure 4:
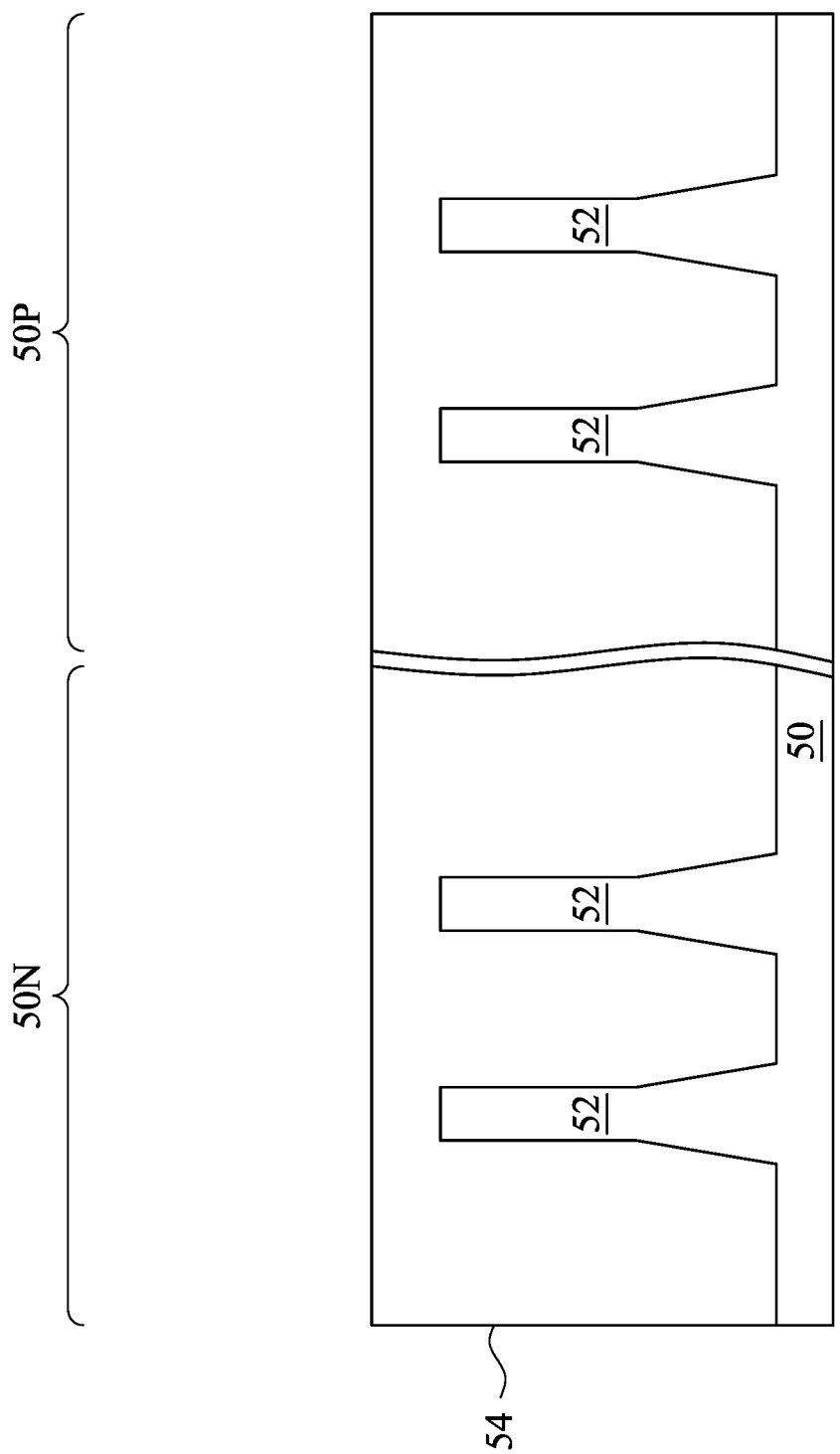

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
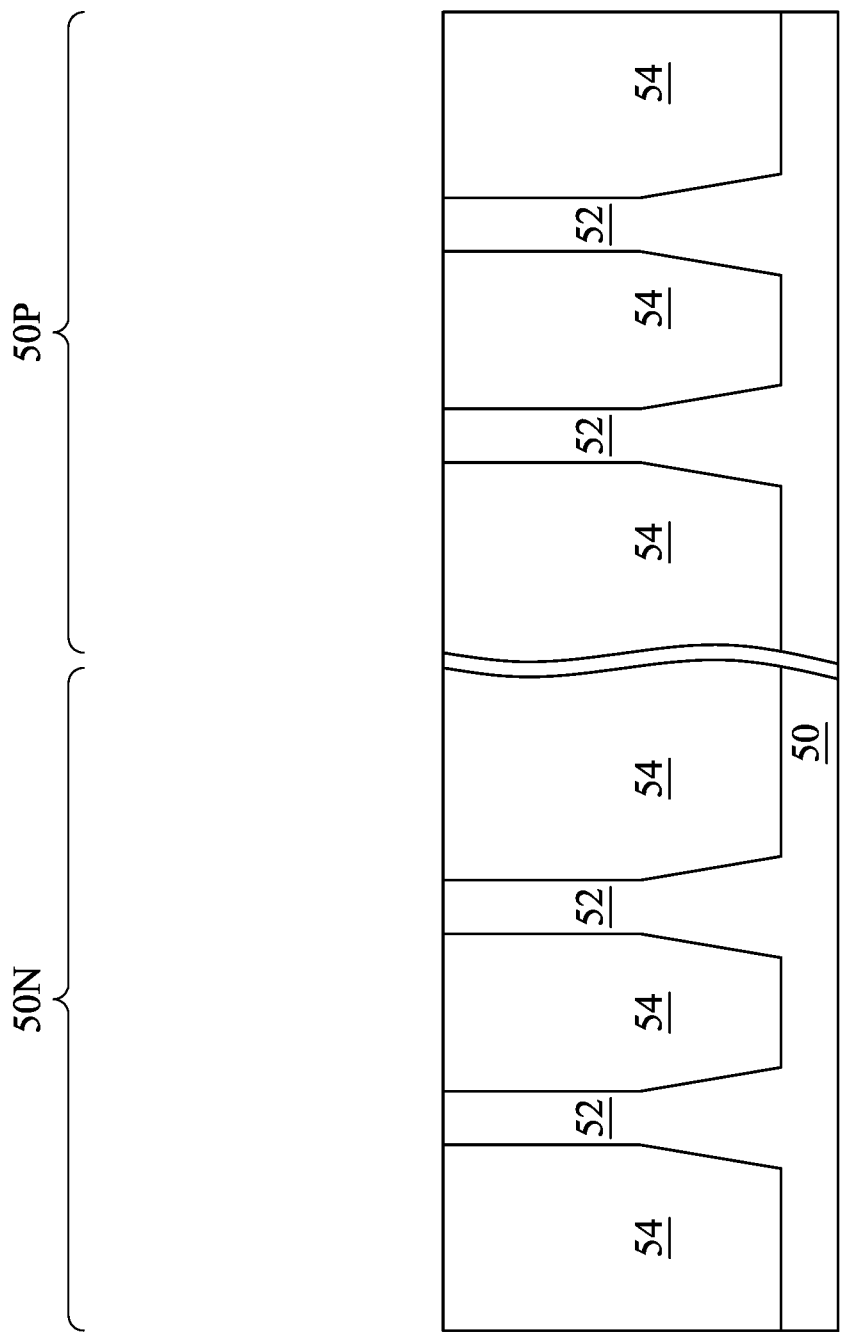

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6:
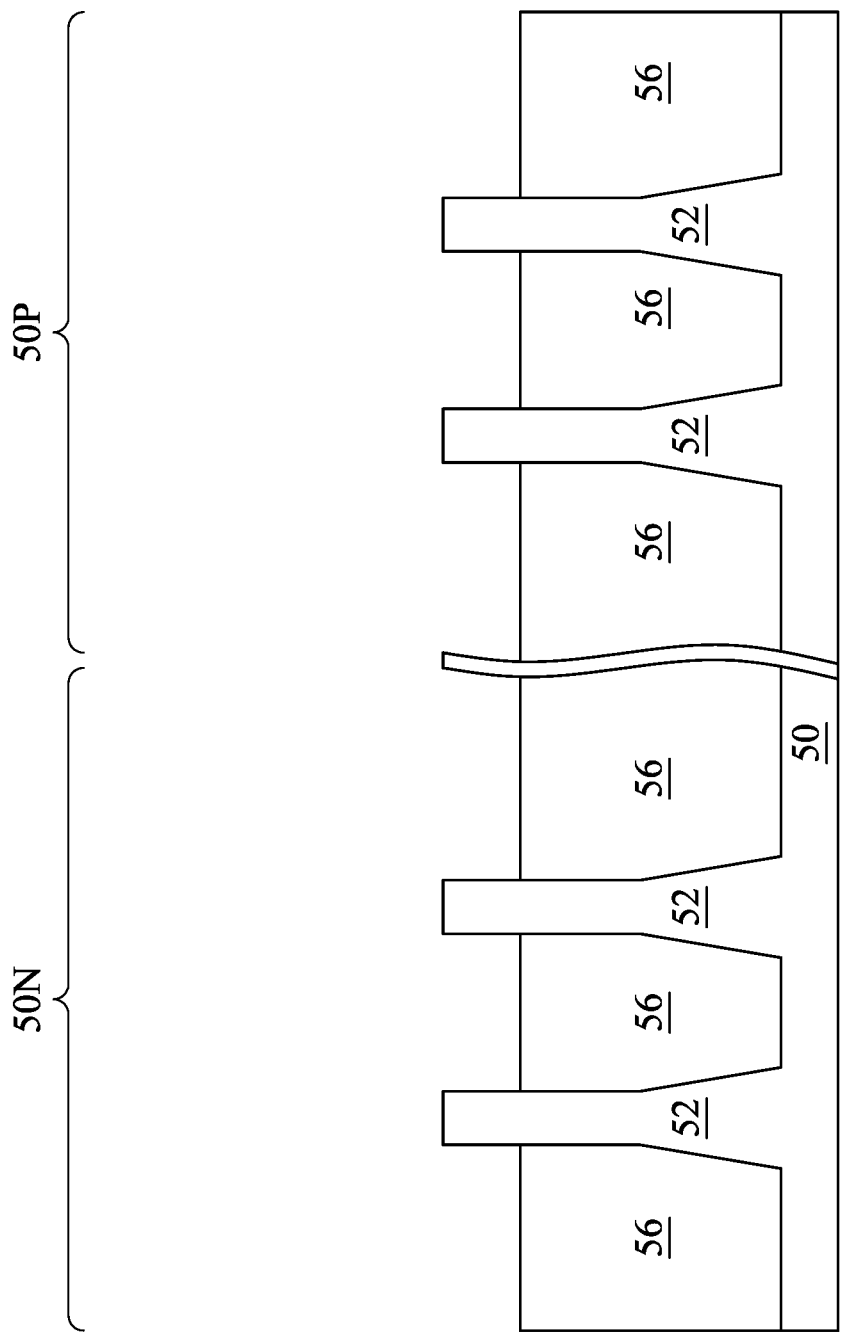

In FIG. 6, the insulation material 54 is recessed to form Shallow Trench Isolation (STI) regions 56. The insulation material 54 is recessed such that upper portions of fins 52 in the n-type region 50N and in the p-type region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in n-type region 50N (e.g., an NMOS region) different from the material in p-type region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not shown) may be formed in the fins 52 and/or the substrate 50. In some embodiments, a P well may be formed in the n-type region 50N, and an N well may be formed in the p-type region 50P. In some embodiments, a P well or an N well are formed in both the n-type region 50N and the p-type region 50P.

In the embodiments with different well types, the different implant steps for the n-type region 50N and the p-type region 50P may be achieved using a photoresist and/or other masks (not shown). For example, a photoresist may be formed over the fins 52 and the STI regions 56 in the n-type region 50N. The photoresist is patterned to expose the p-type region 50P of the substrate 50. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist is removed, such as by an acceptable ashing process.

Following the implanting of the p-type region 50P, a photoresist is formed over the fins 52 and the STI regions 56 in the p-type region 50P. The photoresist is patterned to expose the n-type region 50N of the substrate 50. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

FIGS. 7A through 17C illustrate various additional steps in the manufacturing of embodiment devices. FIGS. 7A through 17C illustrate features in either of the n-type region 50N and the p-type region 50P. For example, the structures illustrated in FIGS. 7A through 17C may be applicable to both the n-type region 50N and the p-type region 50P. Differences (if any) in the structures of the n-type region 50N and the p-type region 50P are described in the text accompanying each figure.

Figure 7B:
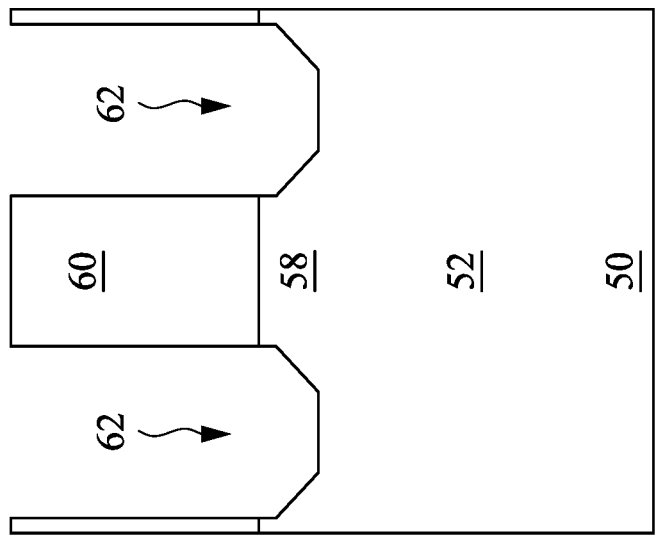
Figure 7A:
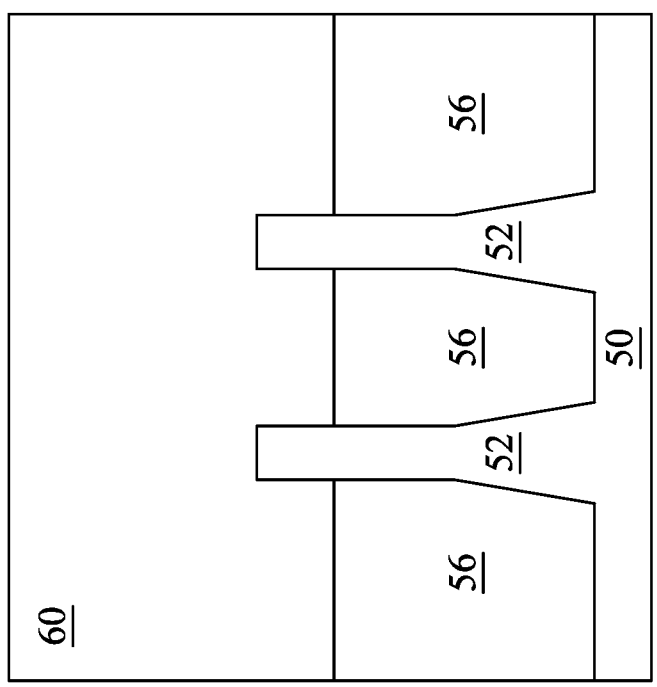
Figure 7C:
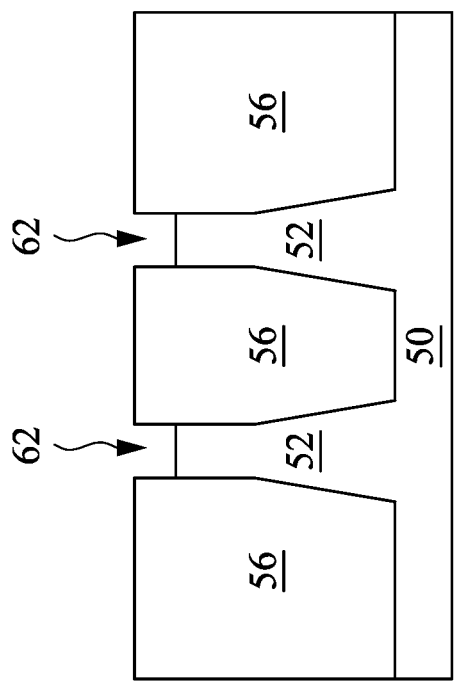

In FIGS. 7A through 8D epitaxial source/drain regions 82 are formed in the fins 52. In some embodiments the epitaxial source/drain regions 82 may extend into, and may optionally penetrate through, the fins 52. Referring to FIGS. 7A through 7C, recesses 62 are patterned into the fins using a combination of photolithography and etching. For example, a hard mask 60 may be formed over the fins 52. The hard mask 60 may comprise silicon nitride, silicon oxynitride, or the like that allows the hard mask 60 to be patterned at a faster rate than the underlying features, such as the STI 56 and the fins 52. The hard mask 60 may be deposited by CVD, ALD, PVD, or the like. Subsequently, the hard mask 60 may be patterned using one or more photolithography and etching processes, including double-patterning or multi-patterning processes.

One or more etching process may then be applied to pattern the recesses 62 in the fins 52. In the illustrated embodiments, the recesses 62 may extend below a top surface of the STI regions 56 (see FIG. 7C) such that top surfaces of the fins 52 are below a top surface of the STI regions 56 in the cross-section C-C. In other embodiments, a top surface of the fins 52 may be level with or above the top surface of the STI regions 56. The recesses 62 may be spaced apart by respective channel regions 58 of the fins 52 (see FIG. 7B), and gate structures may be formed over and along sidewalls of the channel regions 58 in subsequent processing steps. After the recesses 62 are patterned, the hard mask 60 may be removed using, for example, one or more wet cleaning processes, or the like.

In FIGS. 8A through 8D, epitaxial source/drain regions 82 may be formed in the recesses 62. A material of the epitaxial source/drain regions 82 may be selected to exert stress in the respective channel regions 58, thereby improving performance. The epitaxial source/drain regions 82 in the n-type region 50N may be formed by masking the p-type region 50P. Then, the epitaxial source/drain regions 82 in the n-type region 50N are epitaxially grown in the recesses 62. The epitaxial source/drain regions 82 may include any acceptable material, such as appropriate for n-type FinFETs. For example, if the fin 52 is silicon, the epitaxial source/drain regions 82 in the n-type region 50N may include materials exerting a tensile strain in the channel region 58, such as silicon, silicon carbide, phosphorous doped silicon carbide, silicon phosphide, or the like. The epitaxial source/drain regions 82 in the n-type region 50N may have surfaces raised from respective surfaces of the fins 52 and may have facets.

The epitaxial source/drain regions 82 in the p-type region 50P may be formed by masking the n-type region 50N. Then, the epitaxial source/drain regions 82 in the p-type region 50P are epitaxially grown in the recesses 62. The epitaxial source/drain regions 82 may include any acceptable material, such as appropriate for p-type FinFETs. For example, if the fin 52 is silicon, the epitaxial source/drain regions 82 in the p-type region 50P may comprise materials exerting a compressive strain in the channel region 58, such as silicon-germanium, boron doped silicon-germanium, germanium, germanium tin, or the like. The epitaxial source/drain regions 82 in the p-type region 50P may have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

Figure 8B:
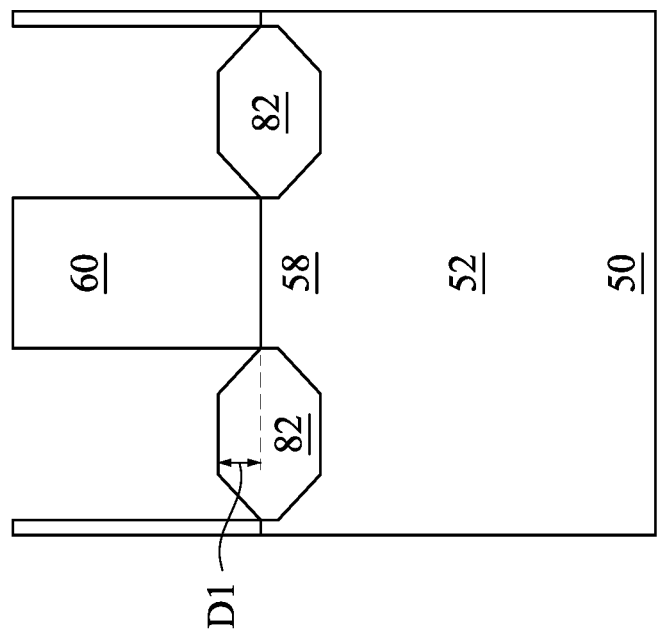
Figure 8A:
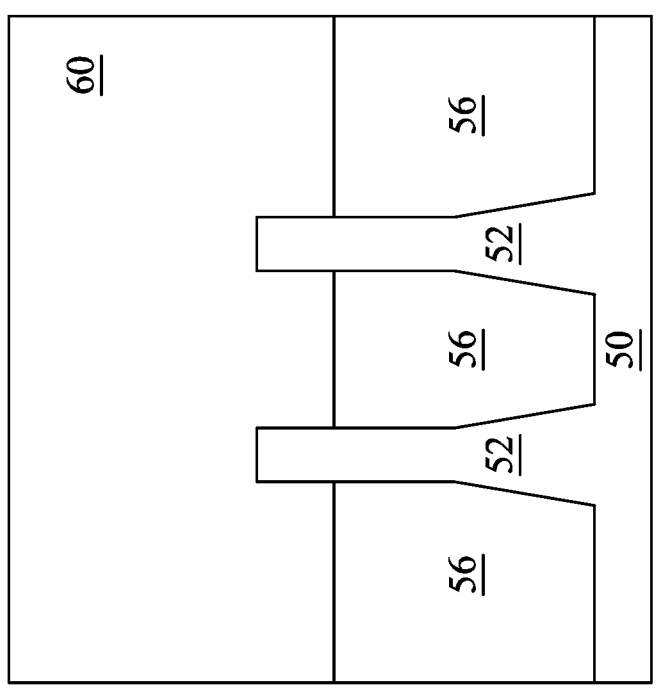
Figure 8D:
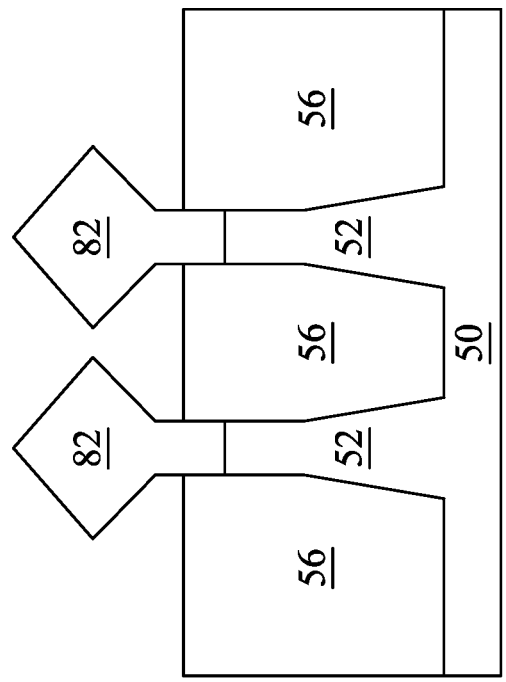
Figure 8C:
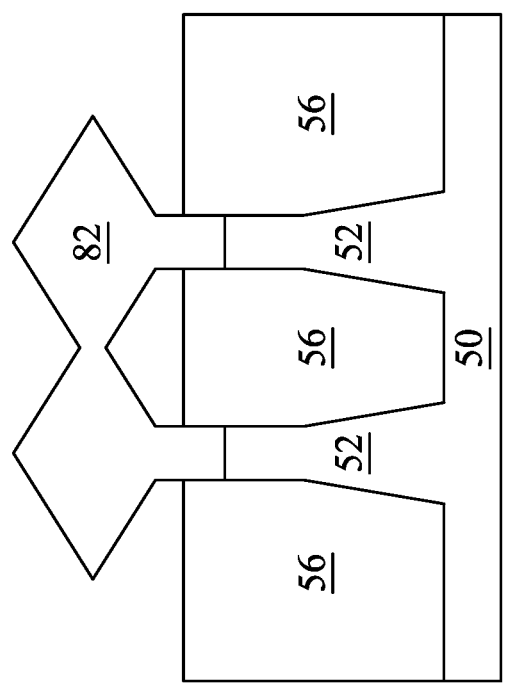
Figure 8E:
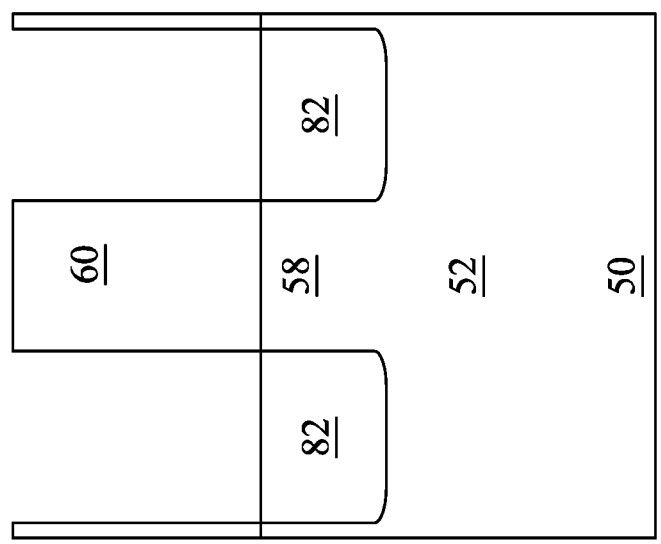

As a result of the epitaxy processes used to form the epitaxial source/drain regions 82 in the n-type region 50N and the p-type region 50P, upper surfaces of the epitaxial source/drain regions 82 have facets which expand laterally outward beyond sidewalls of the fins 52. Further, the upper surfaces of the epitaxial source/drain regions 82 may extend above an upper surface of the fins 52 by a distance D1. The distance D1 may be greater than 10 nm, such as greater than 20 nm in some embodiments. In other embodiments, upper surfaces of the epitaxial source/drain regions 82 may be level with an upper surface of the fins 52 (see FIGS. 8A and 8B). In some embodiments, these facets cause adjacent source/drain regions 82 of a same FinFET to merge as illustrated by FIG. 8C. In other embodiments, adjacent source/drain regions 82 remain separated (e.g., remain unmerged) after the epitaxy process is completed as illustrated by FIG. 8E. In some embodiments, a single chip may include both merged and unmerged source/drain regions 82 depending on circuit design and device density.

Figure 9B:
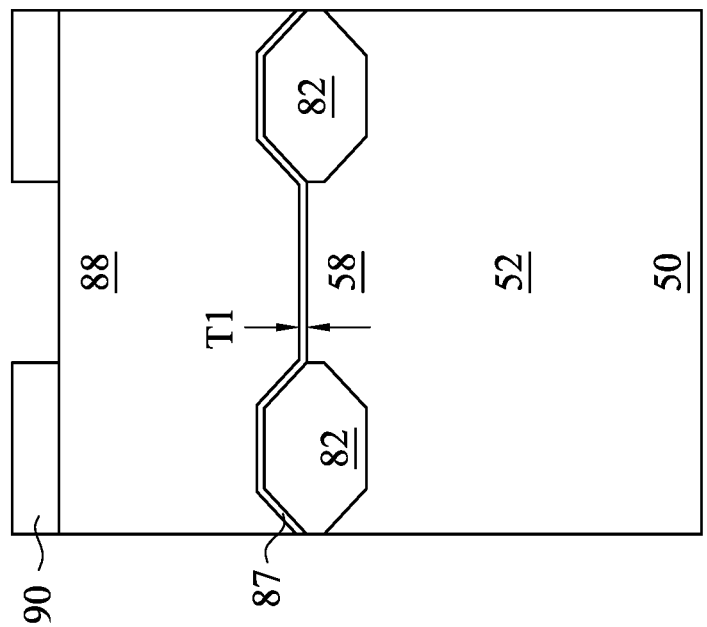
Figure 9A:
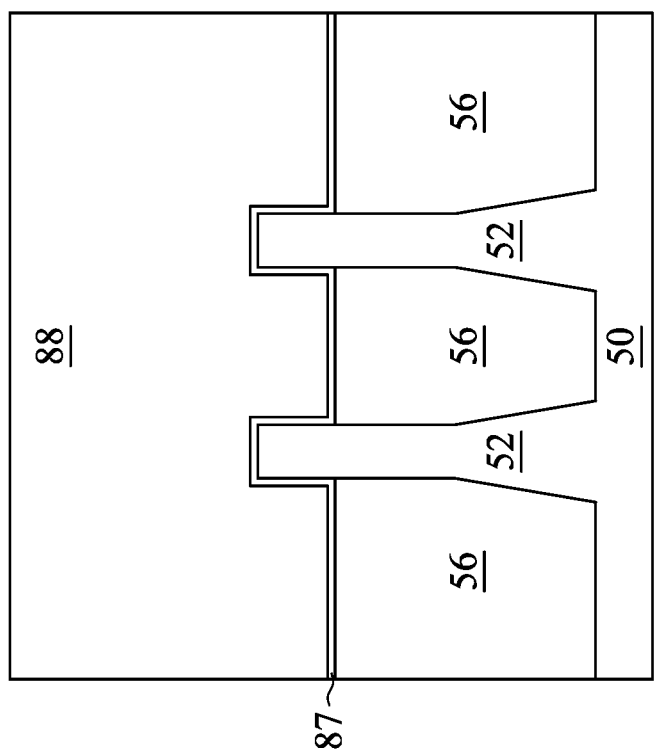
Figure 9C:
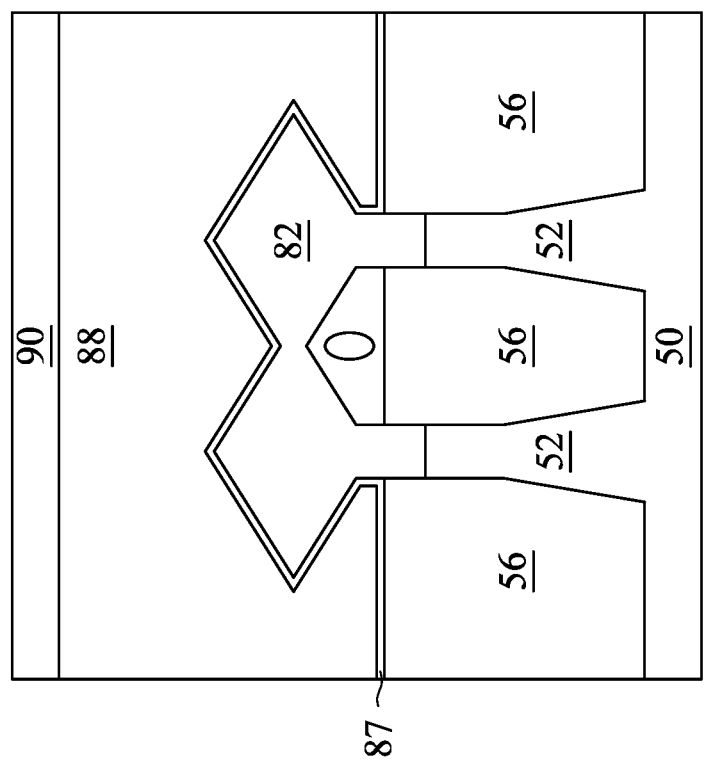

In FIGS. 9A through 9C, a first interlayer dielectric (ILD) 88 is deposited over the structure illustrated in FIGS. 8A through 8E. Although FIGS. 9A through 9C and subsequent figures only illustrates processing on the embodiments of merged, epitaxial source/drain regions 82 with raised upper surfaces (e.g., according to FIGS. 8B and 8C), similar processes may also be applied to unmerged, epitaxial source/drain regions 82 (e.g., see FIG. 8D) and/or epitaxial source/drain regions 82 without raised upper surfaces (e.g., see FIG. 8E).

The first ILD 88 may be formed of a dielectric material, and may be deposited by any suitable method, such as CVD, plasma-enhanced CVD (PECVD), or FCVD. After deposition, a planarization process, such as a CMP, may be performed to level the top surface of the first ILD 88. The first ILD 88 may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82 and the fins 52. The CESL 87 may comprise a dielectric material, such as, silicon nitride, silicon oxide, silicon oxynitride, or the like, having a lower etch rate than the material of the overlying first ILD 88. The first ILD 88 and the CESL 87 may cover the channel regions 58 and may further extend continuously between neighboring pairs of the epitaxial source/drain regions 82. In some embodiments, a thickness T1 of the CESL 87 may be in a range of about 2 nm to about 10 nm. Notably, the first ILD 88 and the CESL 87 may be formed prior to forming any gate structures (e.g., any dummy gates or any functional gates).

As further illustrated by FIGS. 9A through 9C, a hard mask 90 may be formed and patterned over the first ILD 88 to expose areas corresponding to subsequently formed gate stacks. The hard mask 90 may comprise silicon nitride, silicon oxynitride, or the like that allows the hard mask 90 be patterned at a faster rate than the underlying features, such as the first ILD 88. The hard mask 90 may be deposited by CVD, ALD, PVD, or the like. Subsequently, the hard mask 90 may be patterned using one or more photolithography and etching processes, including double-patterning or multi-patterning processes.

Figure 10B:
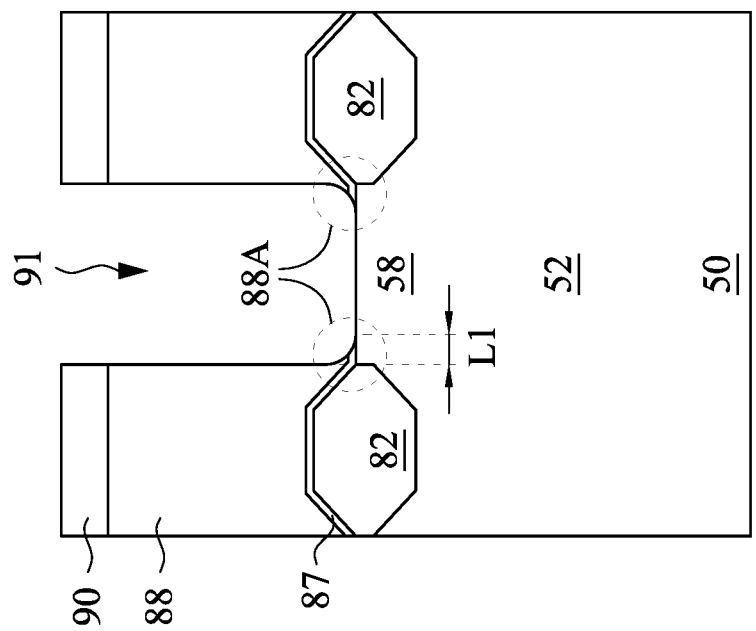
Figure 10A:
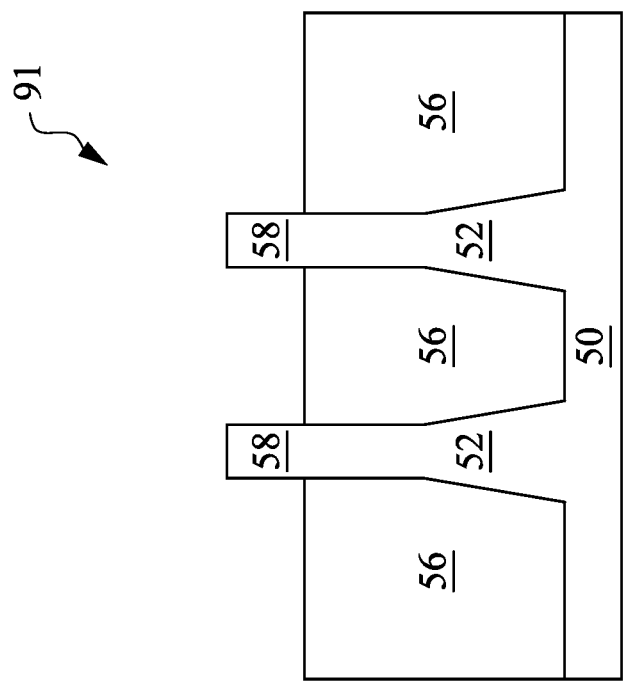

In FIGS. 10A through 10B, openings 91 are etched through the first ILD 88 and the CESL 87 using the hard mask 90 as an etching mask. The openings 91 may be etched using a wet etch process, a dry etch process, combinations thereof, or the like. The etching may be anisotropic. The openings 91 may extend through the first ILD 88 and the CESL 87 to expose a top surface of the fins 52, such as, the channel regions of the fins 52. The openings 91 may be disposed between adjacent epitaxial source/drain regions 82.

As a result of the etching process, sidewalls of the first ILD 88 may be curved (e.g., concave) at bottoms of the openings 91. This region of the first ILD 88 (e.g., with curved sidewalls) may be referred to as footing regions 88A. In some embodiments, a length L1 of the footing regions 88A may be in a range of about 0.5 nm to about 2 nm. The length L1 may refer to a lateral distance between a vertical sidewall of the first ILD 88 and a farthest point that the first ILD 88 extends into the openings 91. In other embodiments, the footing regions 88A may have a different length. The footing region 88A may further result in the bottoms of in the openings 91 tapering and decreasing in width in a direction towards the fins 52.

Figure 11B:
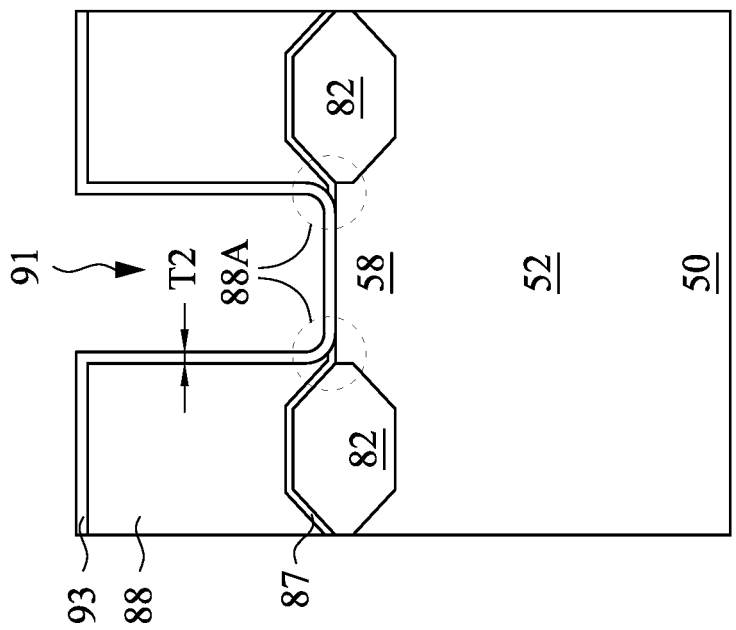
Figure 11A:
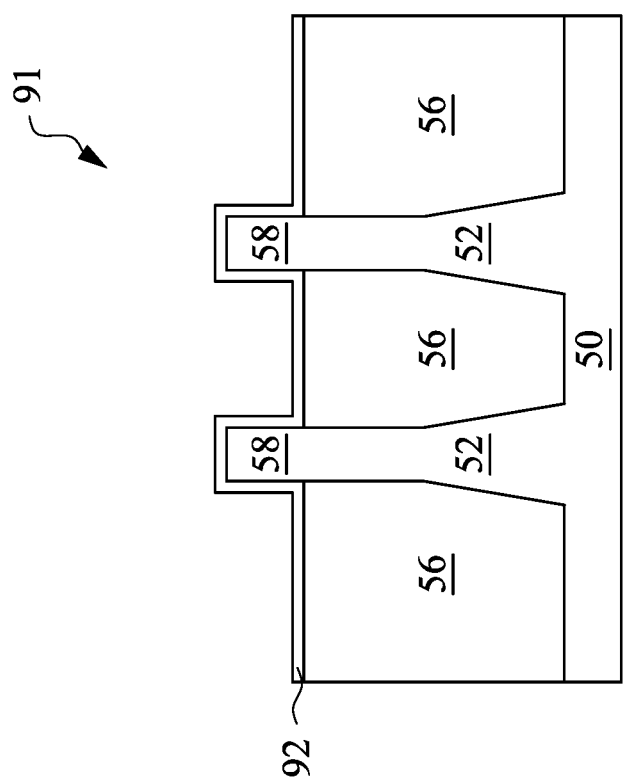

In FIGS. 11A and 11B, a spacer layer 93 is deposited along sidewalls and a bottom surface of the recesses 91. The spacer layer 93 may be formed by conformally depositing an insulating material, such as, silicon oxide, silicon nitride, silicon oxynitride, silicon carbonitride, a combination thereof, or the like. In some embodiments, a thickness T2 of the spacer layer 93 may be in a range of about 2 nm to about 10 nm, for example. Due to the footing regions 88A of the first ILD 88, bottom portions of the spacer layer 93 may also have curved sidewalls.

Figure 12B:
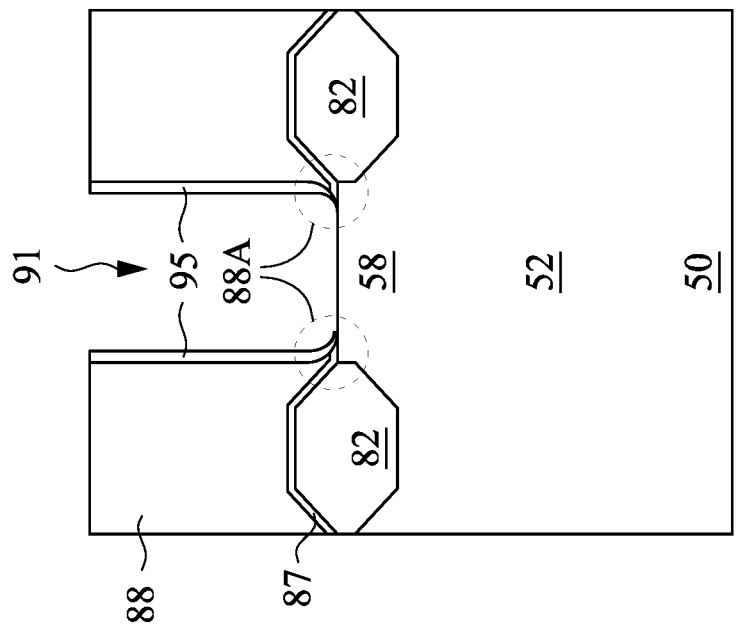
Figure 12A:
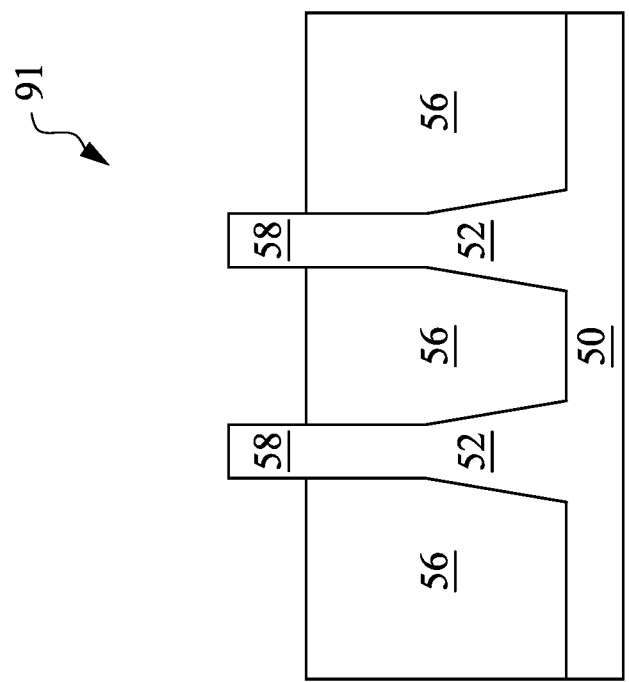

Subsequently, as illustrated in FIGS. 12A and 12B, an anisotropic etching process may be performed to remove lateral portions of the spacer layer 93, thereby forming sidewall spacers 95. In some embodiments, portions of the sidewall spacers 95 in the footing regions 88A may have curved sidewalls, and the spacers may taper (e.g., decrease) in width adjacent to the footing regions 88A. The sidewall spacers 95 may line sidewalls of the recesses 91 to provide insulation and an appropriate spacing between subsequently formed gate stacks and the epitaxial source/drain regions 82.

Figure 13B:
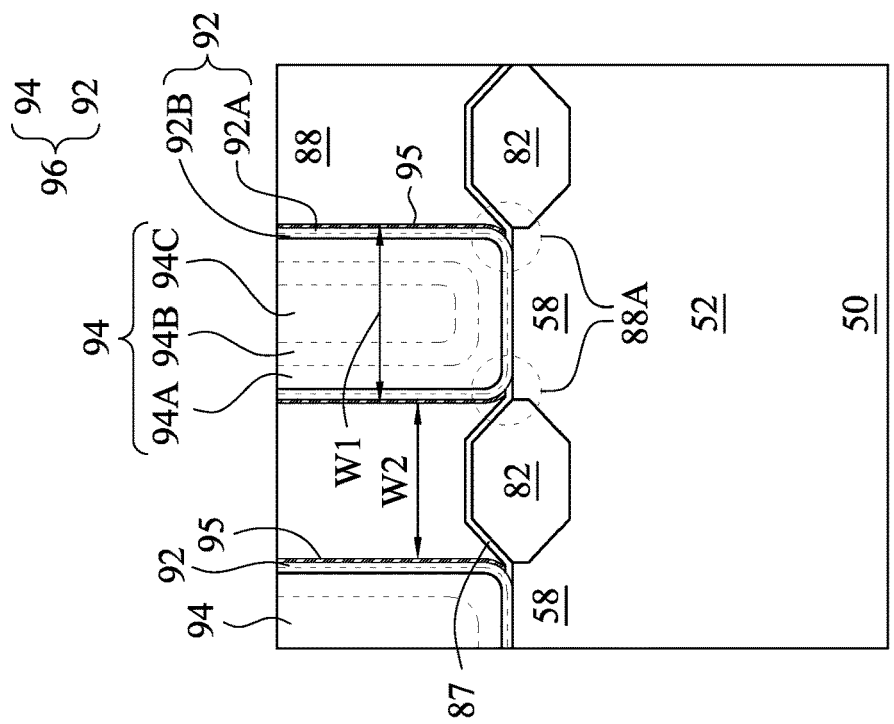
Figure 13A:
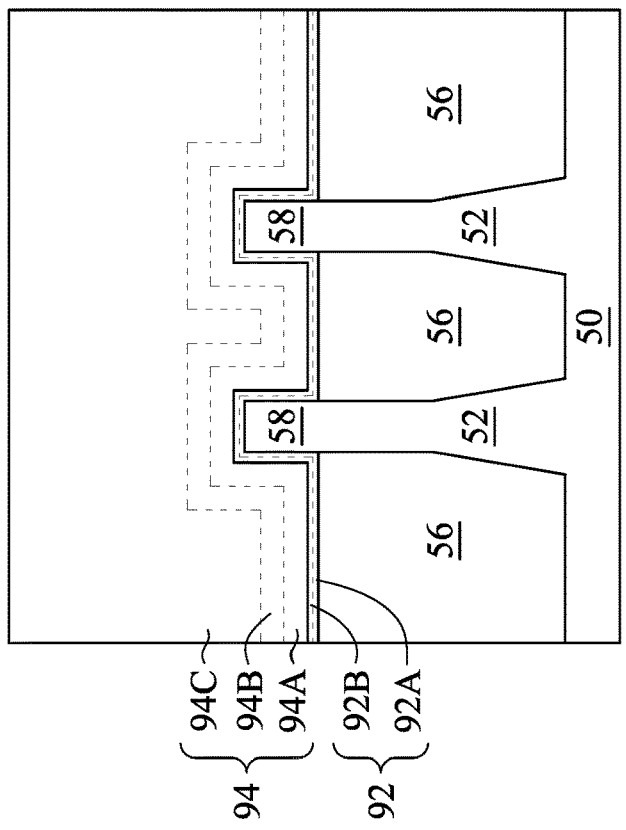
Figure 14B:
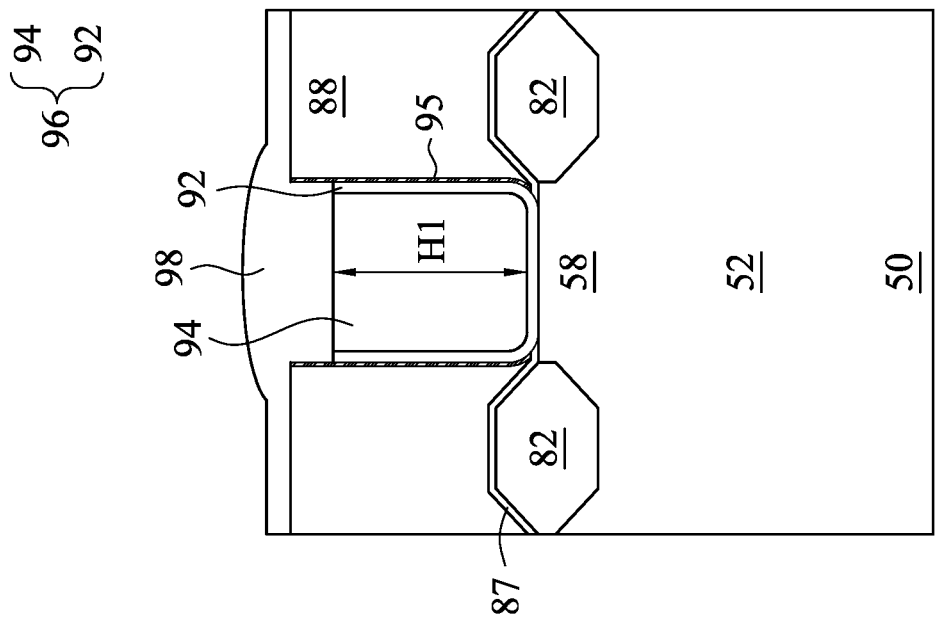
Figure 14A:
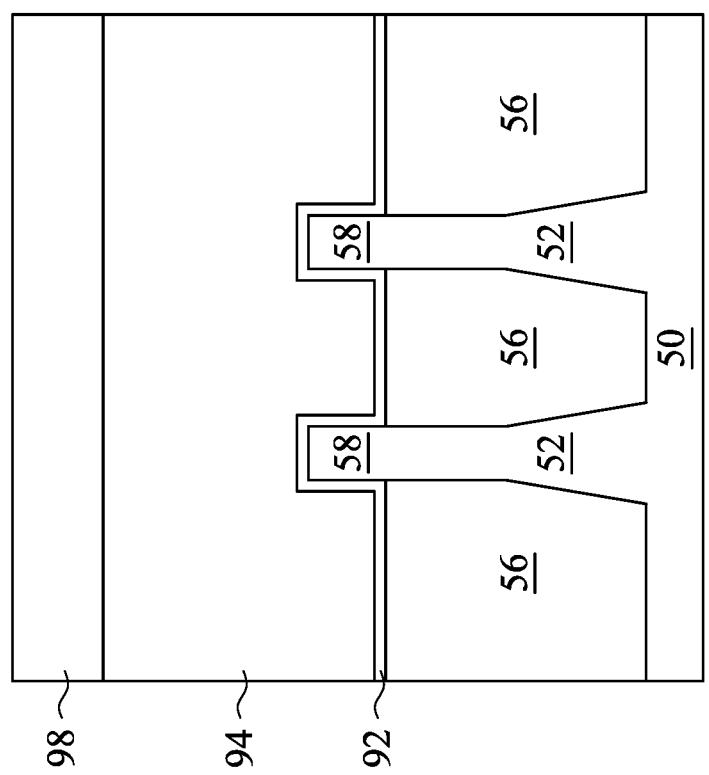

In FIGS. 13A and 13B, gate dielectric layers 92 and gate electrodes 94 are formed for replacement gates. Gate dielectric layers 92 include one or more layers deposited in the recesses 91, such as on the top surfaces and the sidewalls of the fins 52 and on sidewalls of the sidewall spacers 95. The gate dielectric layers 92 may also be formed on the top surface of the first ILD 88. In some embodiments, the gate dielectric layers 92 comprise one or more dielectric layers, such as one or more layers of silicon oxide, silicon nitride, metal oxide, metal silicate, or the like. For example, in some embodiments, the gate dielectric layers 92 include an interfacial layer 92A of silicon oxide formed by thermal or chemical oxidation and an overlying high-k dielectric material 92B, such as a metal oxide or a silicate of hafnium, aluminum, zirconium, lanthanum, manganese, barium, titanium, lead, and combinations thereof. The high-k dielectric material 92B may have a k value greater than about 7.0, for example. The formation methods of the gate dielectric layers 92 may include Molecular-Beam Deposition (MBD), PVD, ALD, PECVD, and the like.

The gate electrodes 94 are deposited over the gate dielectric layers 92, respectively, and fill the remaining portions of the recesses 91. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. The gate electrode 94 may comprise any number of liner layers 94A (e.g., diffusion barrier layers, adhesion layers, and/or the like), any number of work function tuning layers 94B, and a fill material 94C. In some embodiments, one or more of the liner layers 94A may be interposed between the work function tuning layers 94B and the fill material 94C. After the filling of the recesses 91, a planarization process, such as a CMP, may be performed to remove the excess portions of the gate dielectric layers 92 and the material of the gate electrodes 94, which excess portions are over the top surface of the first ILD 88. The remaining portions of material of the gate electrodes 94 and the gate dielectric layers 92 thus form functional gates of the resulting FinFETs. The gate electrodes 94 and the gate dielectric layers 92 may be collectively referred to as a "gate stack 96." The gate stacks 96 may extend along sidewalls of a channel region 58 of the fins 52.

In some embodiments, the gate stacks 96 may have curved sidewalls adjacent to the footing regions 88A of the first ILD 88, and a portion of the CESL 87 may extend directly under the gate stacks 96/the sidewall spacers 95. Further, the gate stacks 96 may have a maximum width W1 (e.g., a width at a top surface of the first ILD 88) that is in a range of about 10 nm to about 100 nm. The lower portions of the gate stacks 96 may taper (e.g., decrease) in width in a direction towards the fins 52. Further, a width W2 of the first ILD 88 between adjacent ones of the gate stacks 96 may be in a range of about 10 nm to about 100 nm.

In various embodiments the gate stacks 96 may be formed without first forming any other gate stacks (including any dummy gates). As a result, the manufacturing process for forming a semiconductor device can be simplified, thereby reducing manufacturing costs. Further, relatively thin sidewall spacers can be formed, thereby enlarging a process window for forming the gate stack 96 and reducing an aspect ratio during the depositing process for forming the layers of the gate stack 96 (e.g., the gate dielectric layers 92 and the gate electrodes 94). It has been observed that by providing sidewall spacers 95 with thicknesses in a range of about 2 nm to about 10 nm, manufacturing defects due to high aspect ratio gap fill can be reduced while still providing adequate isolation between the gate stacks 96 and subsequently formed source/drain contacts.

The formation of the gate dielectric layers 92 in the n-type region 50N and the p-type region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

In FIGS. 14A through 15B, a gate mask 98 is formed over the gate stacks 96 (including a gate dielectric layer 92 and a corresponding gate electrode 94), and the gate mask may be disposed between opposing portions of the gate spacers 86. In some embodiments, forming the gate mask 98 includes recessing the gate stacks 96 so that a recess is formed directly over the gate stack and between opposing portions of sidewall spacers 95. After recessing, a height H1 of the gate stacks 96 may be in a range of about 10 nm to about 80 nm. A gate mask 98 comprising one or more layers of dielectric material, such as silicon nitride, silicon oxynitride, or the like, is filled in the recess (see FIGS. 14A through 14B), followed by a planarization process to remove excess portions of the dielectric material extending over the first ILD 88 (see FIGS. 15A through 15B). After planarization, a thickness H2 of the gate mask 98 may be in a range of about 10 nm to about 89 nm. The gate mask 98 may be thicker than, thinner than, or have an equal thickness as the gate stacks 96. The gate mask 98 is optional and may be omitted in some embodiments. In such embodiments, the gate stack may remain level with top surfaces of the first ILD 88.

Figure 16B:
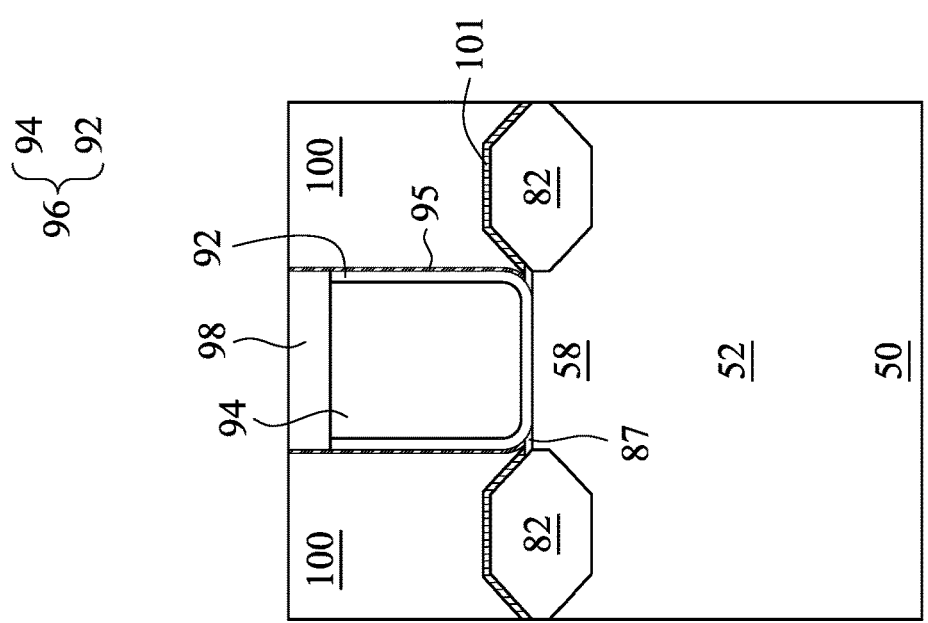
Figure 16A:
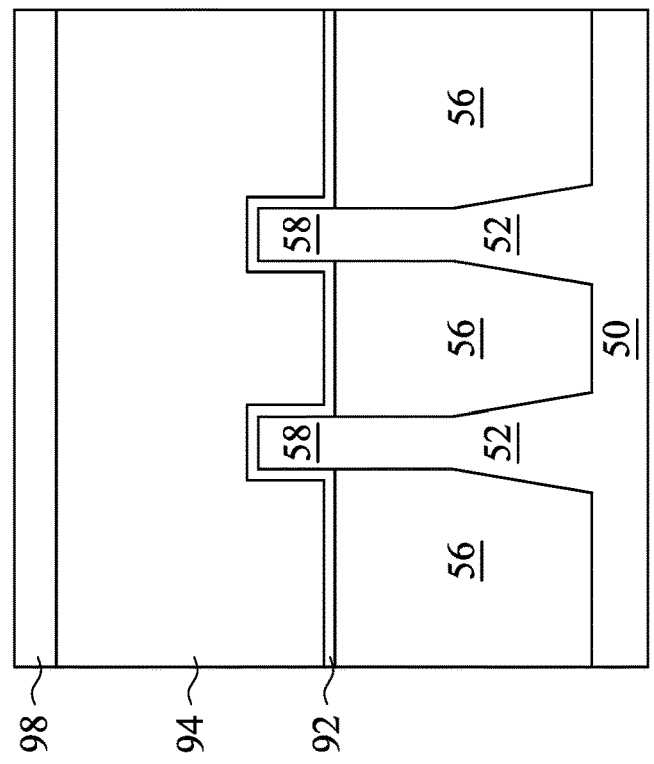
Figure 16C:
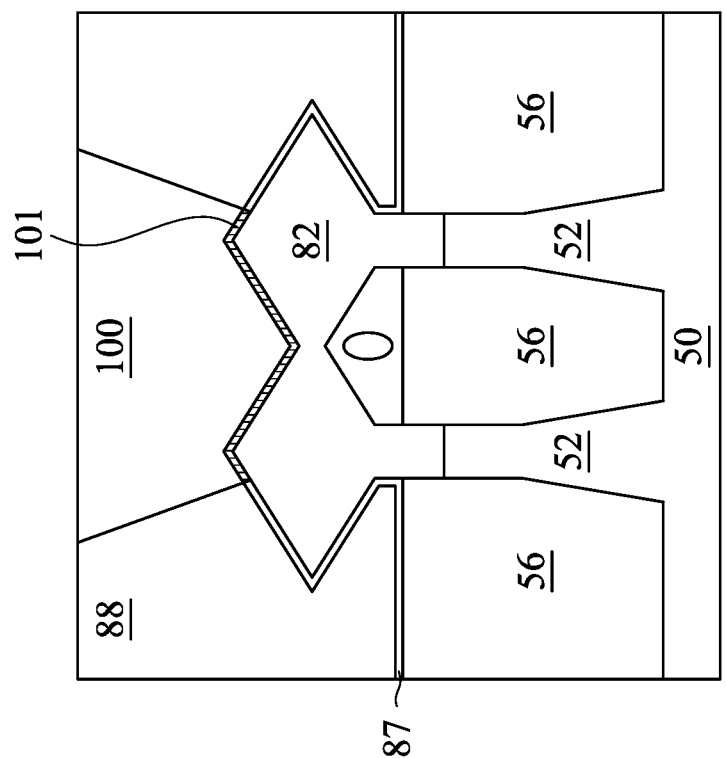

In FIGS. 16A through 16C, first level source/drain contacts 100 are formed through the first ILD 88 in accordance with some embodiments. Openings for the source/drain contacts 100 are formed through the first ILD 88. The openings may be formed using acceptable photolithography and etching techniques. In some embodiments, forming the openings may also etch upper portions of the epitaxial source/drain region. In some embodiments, a distance that the epitaxial source/drain regions 82 extend above the fins 52 after forming the openings may be at least about 10 nm. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the first ILD 88. The remaining liner and conductive material form the source/drain contacts 100 in the openings. An anneal process may be performed to form a silicide 101 at the interface between the epitaxial source/drain regions 82 and the source/drain contacts 100. The source/drain contacts 100 are physically and electrically coupled to the epitaxial source/drain regions 82.

Figure 17B:
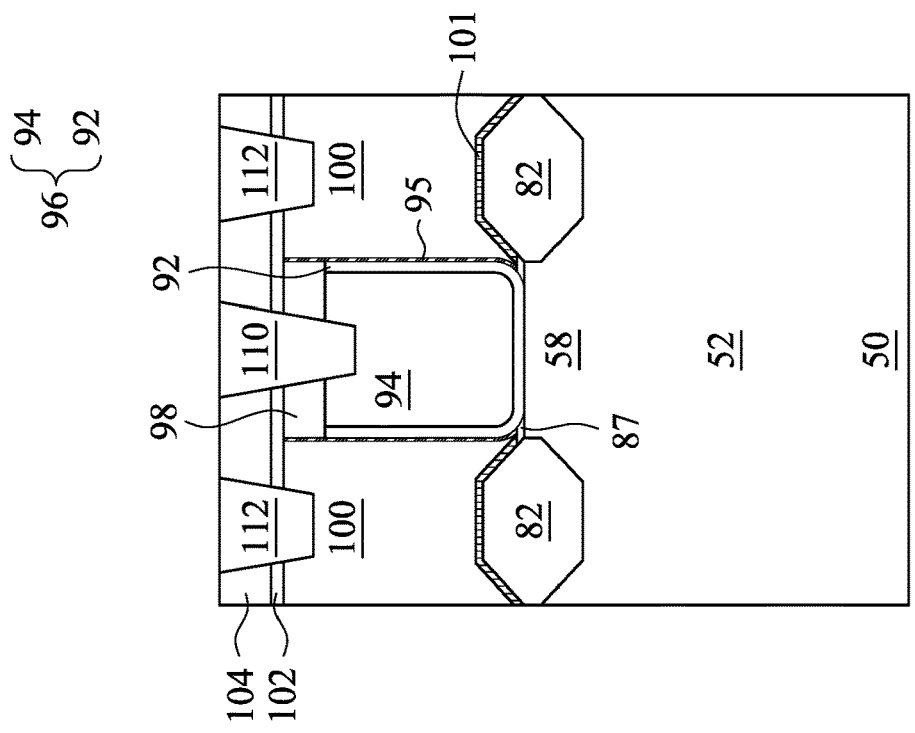
Figure 17A:
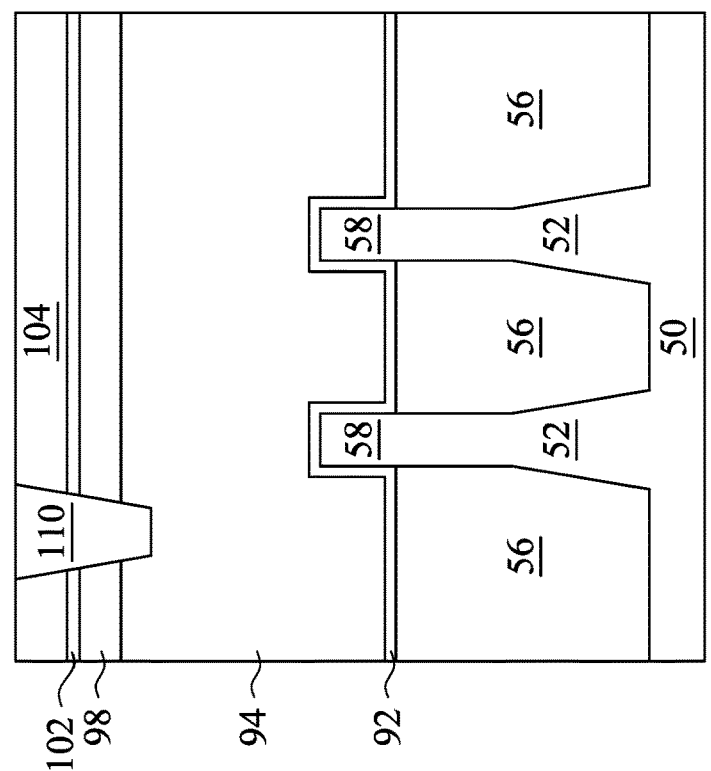
Figure 17C:
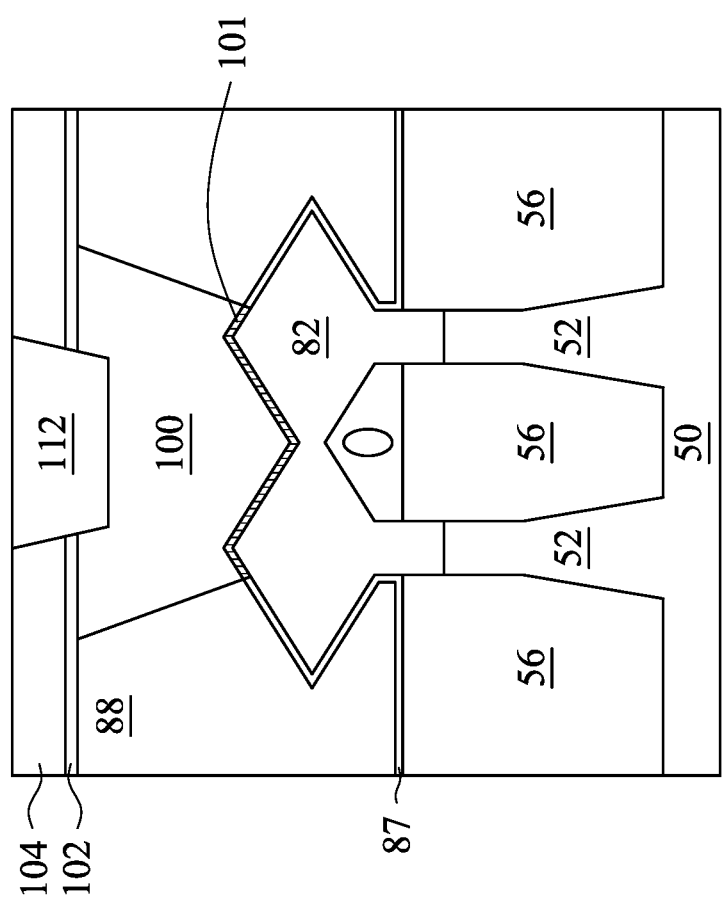

In FIGS. 17A through 17C, a second ILD 104 is deposited over the first ILD 88. In some embodiments, the second ILD 104 is a flowable film formed by a flowable CVD method. In some embodiments, the second ILD 104 is formed of a dielectric material such as PSG, BSG, BPSG, USG, or the like, and may be deposited by any suitable method, such as CVD and PECVD. An optional etch stop layer 102 may be formed between the first ILD 88 and the second ILD 104. In some embodiments the etch stop layer (ESL) 102 may comprise silicon nitride, silicon oxynitride, silicon oxide, or the like and may be deposited by CVD, PVD, ALD, or the like.

As also illustrated in FIGS. 17A through 17C, gate contacts 110 and source/drain contacts 112 are formed through the second ILD 104 and the ESL 102 in accordance with some embodiments. Openings for the source/drain contacts 112 are formed through the second ILD 104 and the ESL 102, and openings for the gate contact 110 are formed through the second ILD 104 and the gate mask 98 (if present). In some embodiments, the openings for the source/drain contacts 112 and/or the gate contact 110 may further etch the source/drain contacts 100 and/or the gate electrode 94, respectively. The openings may be formed using acceptable photolithography and etching techniques. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 104. The remaining liner and conductive material form the source/drain contacts 112 and gate contacts 110 in the openings. The source/drain contacts 112 are physically and electrically coupled to the epitaxial source/drain regions 82 through the source/drain contacts 100, and the gate contacts 110 are physically and electrically coupled to the gate electrodes 94. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

Figure 18B:
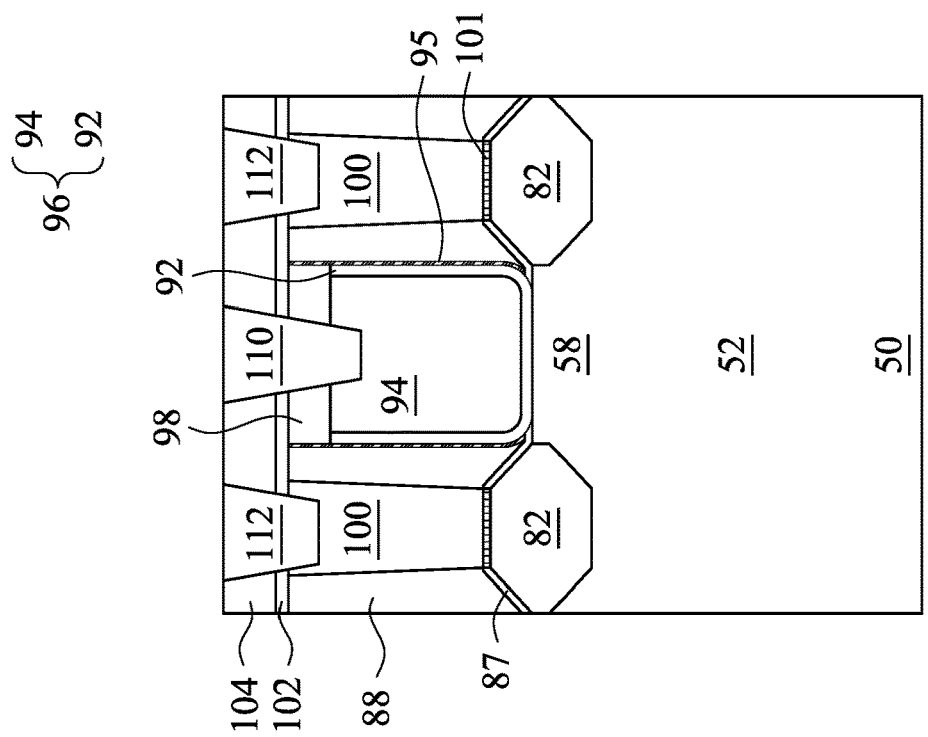
FIGS. 18A, 18B, and 18C are cross-sectional views of a FinFET in accordance with some embodiments.
Figure 18A:
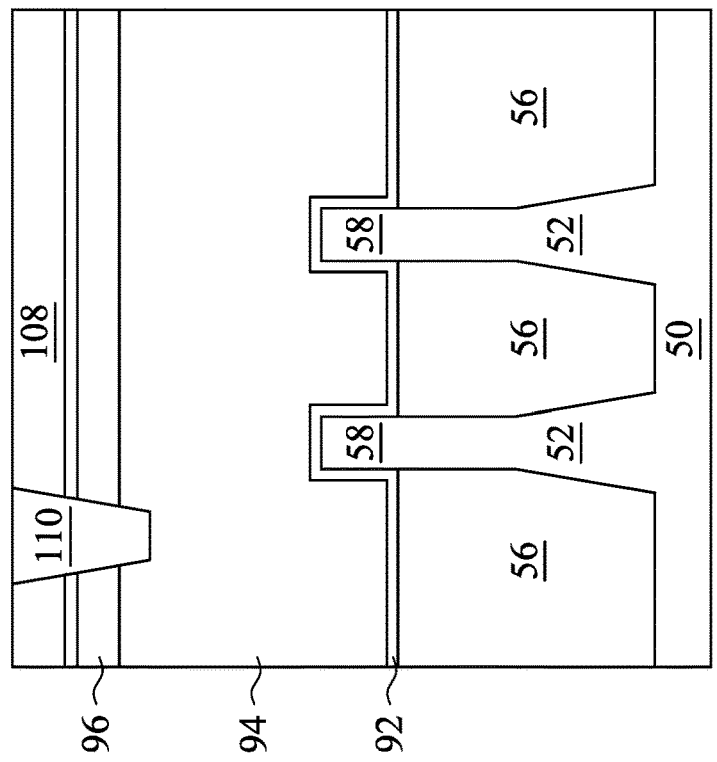
Figure 18C:
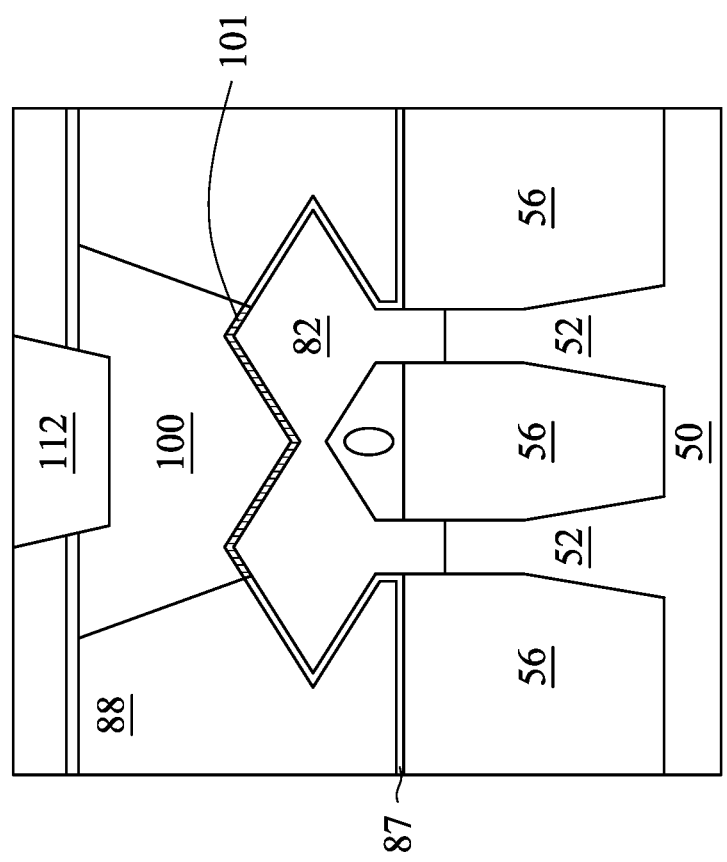

In some embodiments (e.g., as illustrated by FIGS. 17A through 17C), the first level source/drain contacts 100 has contacting the sidewalls spacers 95, and may further extend continuously from a first sidewall spacer 95 to an adjacent sidewall spacer 95 (not explicitly illustrated). In other embodiments, a portion of the first ILD 88 may remain between and physically separate the source/drain contacts 100 and the sidewall spacers 95 as illustrated by FIGS. 18A through 18C. FIG. 18A is illustrated along reference cross-section A-A illustrated in FIG. 1, and FIG. 18B is illustrated along a similar cross-section B-B illustrated in FIG. 1, except for multiple fins/FinFETs. FIG. 18C illustrated along reference cross-section C-C illustrated in FIG. 1, except for multiple fins/FinFETs.

Figure 19:
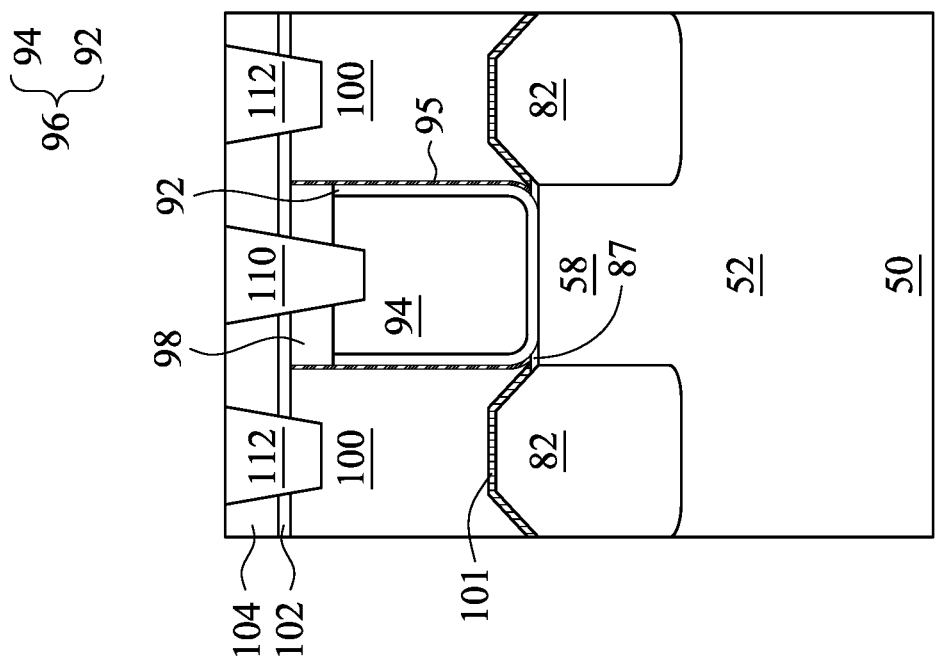
FIG. 19 is a cross-sectional view of a planar transistor in accordance with some embodiments.

The disclosed FinFET embodiments could also be applied to other types of transistors such as planar transistors, nanostructure devices such as nanostructure (e.g., nanosheet, nanowire, gate-all-around, or the like) field effect transistors (NSFETs), or the like. In a planar transistor embodiment, the fins 52 are excluded, and the gate stack 96 is formed on a flat surface of a semiconductor substrate. FIG. 19 illustrates an embodiment planar device where like reference numerals indicate like elements formed by like processes as the embodiments of FIGS. 2 through 17C. In FIG. 19, the fins 52 are excluded, and the gate stacks 96 do not extend along the sidewalls of any channel regions 58.

In an NSFET embodiment, the fins are replaced by nanostructures formed by patterning a stack of alternating layers of channel layers and sacrificial layers. Dummy gate stacks and source/drain regions are formed in a manner similar to the above-described embodiments. Gate isolation structures are also formed to extend through the dummy gate stacks as described above. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments.

Figure 20:
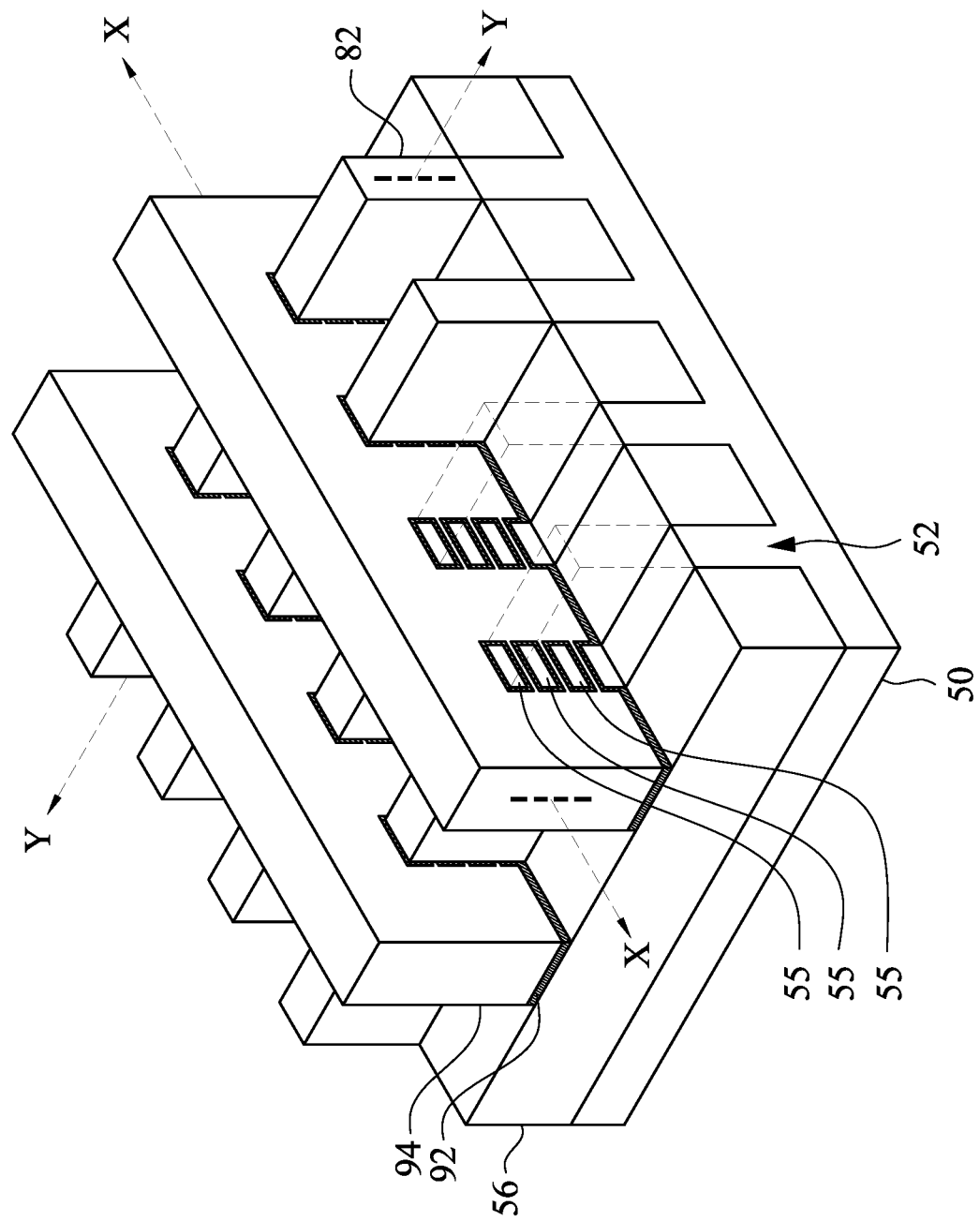
FIGS. 20, 21A, 21B, and 21C are perspective and cross-sectional views of a nanostructure field effect transistor in accordance with some embodiments.
Figure 21B:
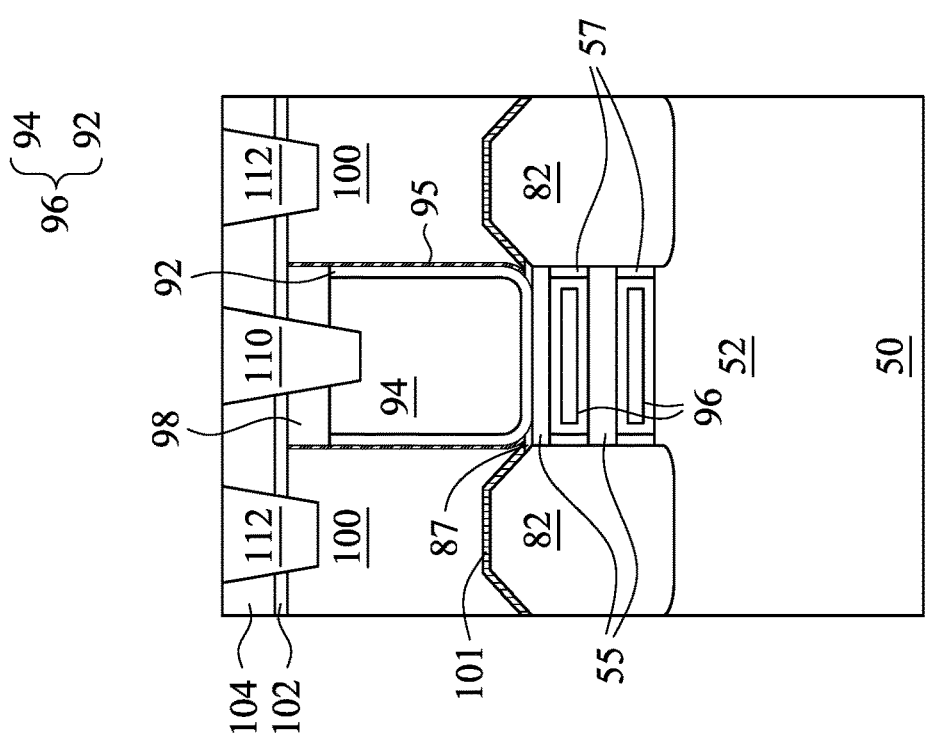
Figure 21A:
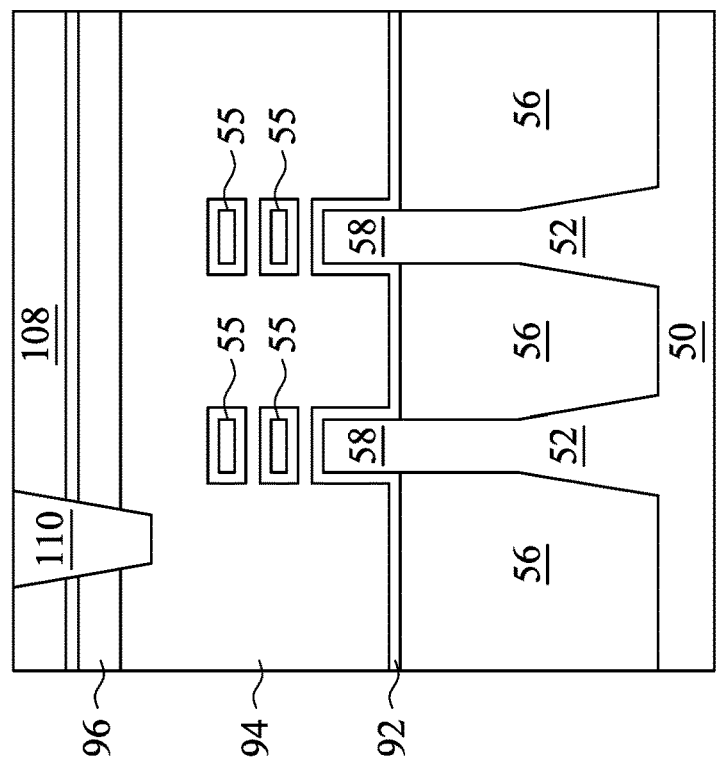
Figure 21C:
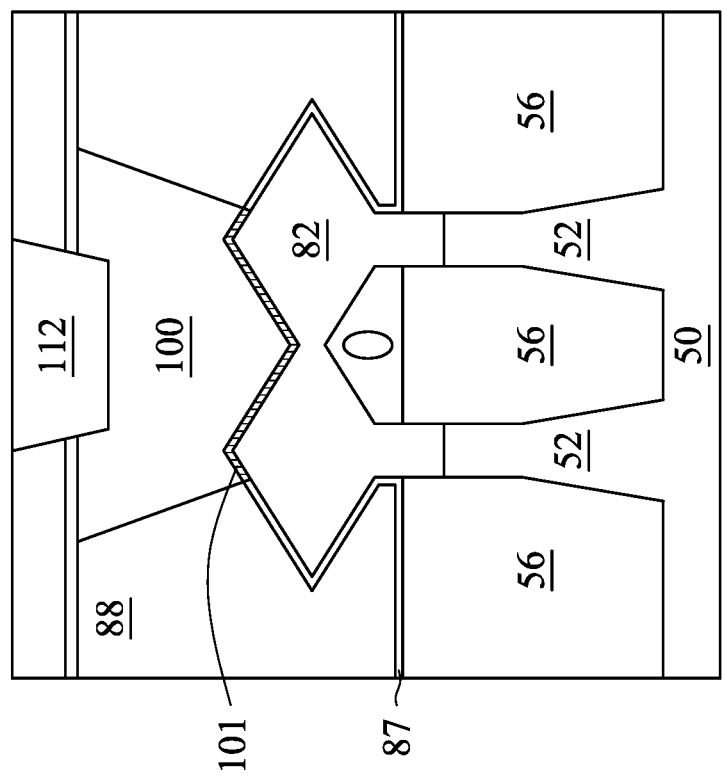

FIG. 20 illustrates a perspective view of a NSFET according to some embodiments. FIGS. 21A through 21C illustrate cross-sectional views of various embodiments—in a NSFET context. Referring to FIG. 20, NSFET devices comprise nanostructures 55 (e.g., nanosheets, nanowire, or the like) over fins 52 on a substrate 50 (e.g., a semiconductor substrate), wherein the nanostructures 55 act as channel regions for the NSFET devices. The nanostructure 55 may include p-type nanostructures, n-type nanostructures, or a combination thereof. The STI regions 56 are disposed between adjacent fins 52, which may protrude above and from between neighboring STI regions 56. The gate dielectric material 92 is over top surfaces of the fins 52 and along top surfaces, sidewalls, and bottom surfaces of the nanostructures 55. Gate electrodes 94 are over the gate dielectric material 92. Epitaxial source/drain regions 82 are disposed on the fins 52 on opposing sides of the gate stacks 92/94.

FIG. 20 further illustrates reference cross-sections that are used in later figures. Cross-section X-X is along a longitudinal axis of a gate electrode 94 and in a direction, for example, perpendicular to the direction of current flow between the epitaxial source/drain regions 82 of a NSFET devices. Cross-section Y-Y is perpendicular to cross-section X-X and is parallel to a longitudinal axis of a fin 52 of the NSFET devices and in a direction of, for example, a current flow between the epitaxial source/drain regions 82 of the NSFET devices. FIG. 21A illustrates an embodiment NSFET device incorporating a gate stack 96 (e.g., as formed and described above in FIGS. 2 through 15C) along the cross-section X-X of FIG. 20, and FIG. 21B illustrates the NSFET device incorporating the gate stack 96 along the cross-section Y-Y of FIG. 20. Various features of FIGS. 21A and 21B may be similar to those described above in FIGS. 1 through 17C where like reference numerals indicate like elements formed by like processes. For example, in FIGS. 21A and 21B, the gate stacks 96 may be formed prior to any other gate structures (e.g., dummy gates) by directly etching openings in the first ILD 88 to expose channel regions and forming the gate stacks 96 in the openings. Lower portions of the gate stacks 96 may taper (e.g., decrease) in width in a direction towards the underlying substrate 50. Further, gate sidewall spacers may be disposed between the gate stacks 96 and the epitaxial source/drain regions 82 to prevent electrical shorts.

Various embodiments provide a gate structure in a transistor device and methods of forming same. The gate structure may be formed without first forming any dummy gate structures (e.g., a polysilicon gate structure). For example, an interlayer dielectric (ILD) may be deposited directly on channel regions and source/drain regions of a substrate. The ILD may then be etched to define openings exposing the channel regions, and various layers of gate dielectrics and gate electrode materials may be deposited in the openings, thereby forming gate stacks. Accordingly, various advantages can be achieved, such as a simplified process flow, easier processing (e.g., without having to pattern high aspect ratio, dummy gates), and reduced manufacturing cost.

In an embodiment, a method includes forming a first source/drain region and a second source/drain region in a semiconductor fin; depositing a first dielectric layer over the first source/drain region and the second source/drain region; etching an opening through the first dielectric layer, wherein etching the opening comprises etching the first dielectric layer; forming first sidewall spacers on sidewalls of the opening; and forming a gate stack in the opening, wherein the gate stack is disposed between the first sidewall spacers. Optionally, in some embodiments, a width of the opening in a lower region of the opening decreases in width in a direction towards the semiconductor fin. Optionally, in some embodiments, an interface between the first sidewall spacers and the first dielectric layer is curved. Optionally, in some embodiments, an interface between the first sidewall spacers and the gate stack is curved. Optionally, in some embodiments, the method further includes prior to depositing the first dielectric layer depositing a contact etch stop layer (CESL) on an upper surface of the semiconductor fin, over the first source/drain region, and over the second source/drain region, wherein patterning the opening comprises etching the CESL. Optionally, in some embodiments, depositing the first dielectric layer comprises depositing a portion of the first dielectric layer to extend continuously from the first source/drain region to the second source/drain region; depositing the CESL comprises depositing a portion of the CESL to extend continuously from the first source/drain region to the second source/drain region; and etching an opening comprises removing the portion of the first dielectric layer and removing the portion of the CESL. Optionally, in some embodiments, a thickness of each of the first sidewall spacers is in a range of 2 nm to 10 nm. Optionally, in some embodiments, the method further includes recessing the gate stack and forming an insulating gate mask over the gate stack.

In an embodiment, a method includes forming a first source/drain region and a second source/drain region in a semiconductor fin; depositing a contact etch stop layer over the semiconductor fin, the first source/drain region, and the second source/drain region; depositing a first dielectric layer over contact etch stop layer; etching the first dielectric layer and the contact etch stop layer to form an opening that exposes the semiconductor fin, wherein after forming the opening, the first dielectric layer comprises a footing region with a curved sidewall that extends into the opening; and forming a gate stack in the opening, wherein at least a lower portion of the gate stack tapers in width in a direction towards the semiconductor fin. Optionally, in some embodiments, a lateral distance between a vertical sidewall of the first dielectric layer and a farthest point that the footing region extends into the opening is in a range of 0.5 nm to 2 nm. Optionally, in some embodiments, the method further includes depositing a spacer layer on sidewalls and a bottom surface of the opening; and etching the spacer layer to form sidewall spacers on sidewalls of the opening. Optionally, in some embodiments, a thickness of the spacer layer is in a range of 2 nm to 10 nm. Optionally, in some embodiments, at least a lower portion of each of the sidewall spacers tapers in width in a direction towards the semiconductor fin. Optionally, in some embodiments, the method further includes forming a first source/drain contact through the first dielectric layer, wherein the first source/drain contact is electrically connected to the first source/drain region; and forming a second source/drain contact through the first dielectric layer, wherein the second source/drain contact is electrically connected to the second source/drain region.

In an embodiment, a device includes a semiconductor fin extending from a semiconductor substrate; a first source/drain region and a second source/drain region in a semiconductor fin; a interlayer dielectric over the semiconductor substrate; a gate stack between the first source/drain region and the second source/drain region, wherein at least a lower portion of the gate stack decreases in width in a direction towards the semiconductor substrate; a first source/drain contact extending through the interlayer dielectric to the first source/drain region; and a second source/drain contact extending through the interlayer dielectric to the second source/drain region. Optionally, in some embodiments, the device further includes a contact etch stop layer on a top surface of the semiconductor fin, wherein the contact etch stop layer is disposed directly under the gate stack. Optionally, in some embodiments, the lower portion of the gate stack has a curved sidewall. Optionally, in some embodiments, the device further includes a first sidewall spacer between the gate stack and the first source/drain contact; and a second sidewall spacer between the gate stack and the second source/drain contact. Optionally, in some embodiments, the first sidewall spacer and the second sidewall spacer each decrease in width in a direction towards the semiconductor substrate. Optionally, in some embodiments, a thickness of the first sidewall spacer is in a range of 2 nm to 10 nm, and wherein a thickness of the second sidewall spacer is in a range of 2 nm to 10 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first source/drain region and a second source/drain region in a semiconductor fin;
   depositing a first dielectric layer over the first source/drain region and the second source/drain region;
   etching an opening through the first dielectric layer, wherein etching the opening comprises etching the first dielectric layer;
   forming first sidewall spacers on sidewalls of the opening; and
   forming a gate stack in the opening, wherein the gate stack is disposed between the first sidewall spacers.

2. The method of claim 1, wherein a width of the opening in a lower region of the opening decreases in width in a direction towards the semiconductor fin.

3. The method of claim 1, wherein an interface between the first sidewall spacers and the first dielectric layer is curved.

4. The method of claim 1, wherein an interface between the first sidewall spacers and the gate stack is curved.

5. The method of claim 1 further comprising:
   prior to depositing the first dielectric layer depositing a contact etch stop layer (CESL) on an upper surface of the semiconductor fin, over the first source/drain region, and over the second source/drain region, wherein etching the opening comprises etching the CESL.

6. The method of claim 5, wherein:
depositing the first dielectric layer comprises depositing a portion of the first dielectric layer to extend continuously from the first source/drain region to the second source/drain region;
depositing the CESL comprises depositing a portion of the CESL to extend continuously from the first source/drain region to the second source/drain region; and
etching the opening comprises removing the portion of the first dielectric layer and removing the portion of the CESL.

7. The method of claim 1, wherein a thickness of each of the first sidewall spacers is in a range of 2 nm to 10 nm.

8. The method of claim 1 further comprising recessing the gate stack and forming an insulating gate mask over the gate stack.

9. A device comprising:
a semiconductor fin extending from a semiconductor substrate;
a first source/drain region and a second source/drain region in the semiconductor fin;
an interlayer dielectric over the semiconductor substrate;
a gate stack between the first source/drain region and the second source/drain region, wherein at least a lower portion of the gate stack decreases in width in a direction towards the semiconductor substrate;
a first source/drain contact extending through the interlayer dielectric to the first source/drain region;
a second source/drain contact extending through the interlayer dielectric to the second source/drain region;
a first sidewall spacer between the gate stack and the first source/drain contact; and
a second sidewall spacer between the gate stack and the second source/drain contact, wherein the first sidewall spacer and the second sidewall spacer each decrease in width in a direction towards the semiconductor substrate.

10. A method comprising:
forming a first source/drain region and a second source/drain region in a semiconductor fin;
depositing a contact etch stop layer over the semiconductor fin, the first source/drain region, and the second source/drain region;
depositing a first dielectric layer over the contact etch stop layer;
etching the first dielectric layer and the contact etch stop layer to form an opening that exposes the semiconductor fin, wherein after forming the opening, the first dielectric layer comprises a footing region with a curved sidewall that extends into the opening; and
forming a gate stack in the opening, wherein at least a lower portion of the gate stack tapers in width in a direction towards the semiconductor fin.

11. The method of claim 10, wherein a lateral distance between a vertical sidewall of the first dielectric layer and a farthest point that the footing region extends into the opening is in a range of 0.5 nm to 2 nm.

12. The method of claim 10 further comprising:
depositing a spacer layer on sidewalls and a bottom surface of the opening; and
etching the spacer layer to form sidewall spacers on sidewalls of the opening.

13. The method of claim 12, wherein a thickness of the spacer layer is in a range of 2 nm to 10 nm.

14. The method of claim 12, wherein at least a lower portion of each of the sidewall spacers tapers in width in a direction towards the semiconductor fin.

15. The method of claim 10 further comprising:
forming a first source/drain contact through the first dielectric layer, wherein the first source/drain contact is electrically connected to the first source/drain region; and
forming a second source/drain contact through the first dielectric layer, wherein the second source/drain contact is electrically connected to the second source/drain region.

16. The device of claim 9, wherein a thickness of the first sidewall spacer is in a range of 2 nm to 10 nm, and wherein a thickness of the second sidewall spacer is in a range of 2 nm to 10 nm.

17. The device of claim 9 further comprising a contact etch stop layer on a top surface of the semiconductor fin, wherein the contact etch stop layer is disposed directly under the gate stack.

18. The device of claim 9, wherein the lower portion of the gate stack has a curved sidewall.

19. The device of claim 9, wherein the first source/drain contact extends directly under a lower portion of the first sidewall spacer.

20. The device of claim 9, wherein the first source/drain contact extends directly under the lower portion of the gate stack.

* * * * *